(12) United States Patent  
Matsumura et al.

(10) Patent No.: US 11,945,887 B2  
(45) Date of Patent: Apr. 2, 2024

(54) CURABLE COMPOSITION, FILM, NEAR-INFRARED CUT FILTER, SOLID-STATE IMAGING ELEMENT, IMAGE DISPLAY DEVICE, INFRARED SENSOR, AND CAMERA MODULE

(71) Applicant: FUJIFILM Corporation, Tokyo (JP)

(72) Inventors: Tokihiko Matsumura, Haibara-gun (JP); Suguru Samejima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 468 days.

(21) Appl. No.: 17/119,333

(22) Filed: Dec. 11, 2020

(65) Prior Publication Data

US 2021/0102010 A1 Apr. 8, 2021

Related U.S. Application Data

(63) Continuation of application No. PCT/JP2019/025810, filed on Jun. 28, 2019.

(30) Foreign Application Priority Data

Jul. 6, 2018 (JP) ................. 2018-128804

(51) Int. Cl.  
*G02B 5/20* (2006.01)  
*C08F 20/28* (2006.01)  
*H01L 27/146* (2006.01)

(52) U.S. Cl.  
CPC .............. *C08F 20/28* (2013.01); *G02B 5/208* (2013.01); *H01L 27/1462* (2013.01); *H01L 27/14621* (2013.01); *H01L 27/14627* (2013.01); *H01L 27/14645* (2013.01)

(58) Field of Classification Search  
CPC ........... G02B 5/22; G02B 5/223; G02B 5/208  
See application file for complete search history.

(56) References Cited

U.S. PATENT DOCUMENTS

| | | | |
|---|---|---|---|
| 4,175,956 A | 11/1979 | Haley et al. | |
| 5,147,758 A * | 9/1992 | Smothers | C08F 2/50 430/281.1 |
| 2017/0210925 A1 | 7/2017 | Hattori et al. | |
| 2018/0067243 A1* | 3/2018 | Shiono | G02B 5/22 |
| 2018/0120485 A1 | 5/2018 | Oota et al. | |
| 2019/0101672 A1* | 4/2019 | Kasai | G02B 5/223 |

FOREIGN PATENT DOCUMENTS

| | | | |
|---|---|---|---|
| JP | 6-506492 A | 7/1994 | |
| JP | 2000-345059 A | 12/2000 | |
| JP | 2003-301009 A | 10/2003 | |
| JP | 2004-319309 A | 11/2004 | |
| JP | 2008-74922 A | 4/2008 | |
| JP | 2015-68945 A | 4/2015 | |
| JP | 2016-74649 A | 5/2016 | |
| JP | 2017-132891 A | 8/2017 | |
| JP | 2017-159947 A | 9/2017 | |
| JP | 2018-82923 A | 6/2018 | |
| WO | WO 2008/035533 A1 | 3/2008 | |
| WO | WO 2016/196050 A1 | 11/2016 | |
| WO | WO-2017164024 A1 * | 9/2017 | ............. G02B 5/003 |

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2019/025810, dated Jan. 21, 2021, with English translation.  
International Search Report (Form PCT/ISA/210) for International Application No. PCT/JP2019/025810, dated Aug. 13, 2019, with English translation.

(Continued)

*Primary Examiner* — Mark F. Huff  
*Assistant Examiner* — Nicholas E Brown  
(74) *Attorney, Agent, or Firm* — Birch, Stewart, Kolasch & Birch, LLP

(57) ABSTRACT

Provided are a curable composition including a compound represented by Formula (1) or Formula (2), a curable compound, and a solvent; a film formed of the curable composition; a near-infrared cut filter; a solid-state imaging element; an image display device; an infrared sensor; and a camera module. In the formulae, $X^1$ to $X^5$ each independently represent O, S, or a dicyanomethylene group, and $R^1$ to $R^5$ each independently represent a group represented by Formula (R2), and the like, in which at least one of $R^1$ or $R^2$ is the group represented by Formula (R2) and at least one of $R^3$ or $R^4$ is the group represented by Formula (R2).

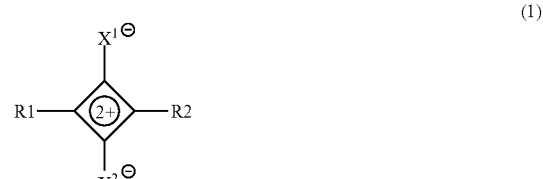

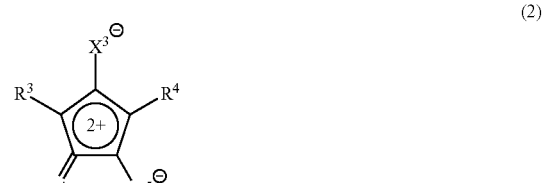

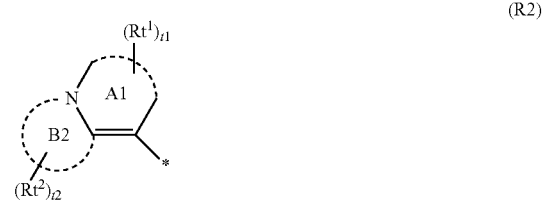

10 Claims, 1 Drawing Sheet

(56) References Cited

OTHER PUBLICATIONS

Piechowski et al., "Desirable properties of photovoltaic dyes." The Journal of Physical Chemistry, vol. 88, No. 5, 1984, pp. 934-950.
Prostota et al., "New unsymmetrical squaraine dyes derived from imidazo [1, 5-a]pyridine," Dyes and Pigments, vol. 96, 2013 (Available online Oct. 17, 2012), pp. 554-562.
Japanese Notice of Reasons for Refusal for corresponding Japanese Application No. 2020-528834, dated Jan. 11, 2022, with an English translation.
Office Action for corresponding Taiwanese Patent Application No. 108123065, dated Nov. 17, 2022, with an English translation.

* cited by examiner

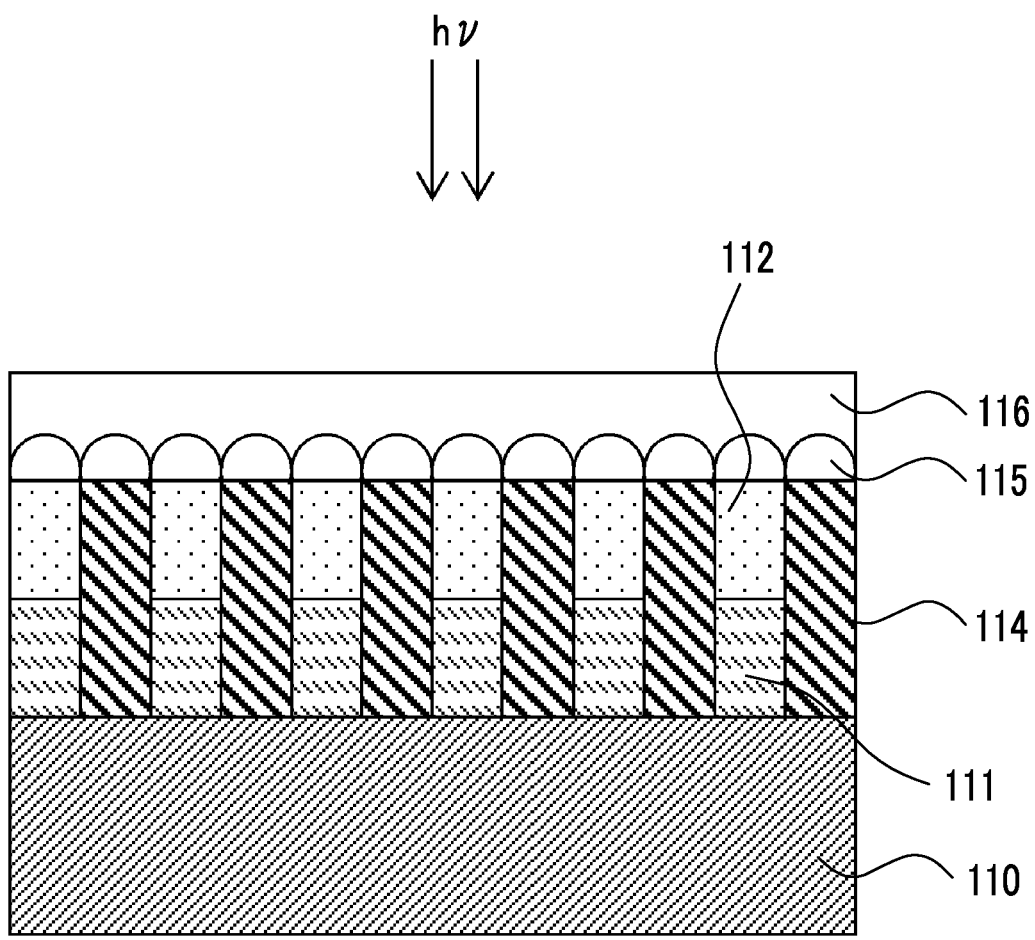

CURABLE COMPOSITION, FILM, NEAR-INFRARED CUT FILTER, SOLID-STATE IMAGING ELEMENT, IMAGE DISPLAY DEVICE, INFRARED SENSOR, AND CAMERA MODULE

CROSS-REFERENCE TO RELATED APPLICATIONS

This application is a Continuation of PCT International Application No. PCT/JP2019/025810 filed on Jun. 28, 2019, which claims priority under 35 U.S.C. § 119(a) to Japanese Patent Application No. 2018-128804 filed on Jul. 6, 2018. Each of the above application(s) is hereby expressly incorporated by reference, in its entirety, into the present application.

BACKGROUND OF THE INVENTION

1. Field of the Invention

The present invention relates to a curable composition including a squarylium compound or a croconium compound. The present invention further relates to a film, a near-infrared cut filter, a solid-state imaging element, an image display device, an infrared sensor, and a camera module.

2. Description of the Related Art

A charge coupled device (CCD) or a complementary metal-oxide semiconductor (CMOS), which are solid-state imaging elements of color images, has been used in video cameras, digital still cameras, mobile phones with camera function, and the like. Since silicon photodiodes having sensitivity to infrared light are used in a light receiving portion of these solid-state imaging elements, it is necessary to correct visual sensitivity and a near-infrared cut filter is often used for that purpose.

For example, WO2016/186050A and JP2016-074649A disclose a manufacture of a near-infrared cut filter and the like using a curable composition including a squarylium compound or a croconium compound.

On the other hand, J. Phys. chem. 1984, 88, pp. 934 to 950 is a reference disclosing the relationship between physical properties and solar cell characteristics of a squarylium compound, and discloses solar cell characteristics of a compound having the following structure.

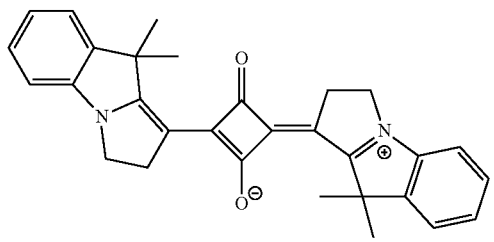 [SMILES: CC1(C)C2=C(C3=C([O-])/C(=C4/CC[N+]5=C4C(C)(C)c4ccccc45)C3=O)CCN2c2ccccc21]

SUMMARY OF THE INVENTION

The present inventor has conducted various studies on a film obtained using a curable composition including a squarylium compound or a croconium compound, and has found that there is a room for further improvement in light resistance and moisture resistance.

J. Phys. chem. 1984, 88, pp. 934 to 950 is a reference disclosing the relationship between physical properties and solar cell characteristics of a squarylium compound. In J. Phys. chem. 1984, 88, pp. 934 to 950, a vapor-deposited coloring agent film is formed on aluminum oxide and solar cell characteristics thereof are evaluated. However, J. Phys. chem. 1984, 88, pp. 934 to 950 does not include a disclosure in which a squarylium compound is used by being blended in a curable composition including a solvent and a curable compound, or a suggestion thereof.

Therefore, an object of the present invention is to provide a curable composition with which a film having excellent light resistance and moisture resistance can be formed. Another object of the present invention is to provide a film, a near-infrared cut filter, a solid-state imaging element, an image display device, an infrared sensor, and a camera module.

As a result of various studies, the present inventors have found that the above-described objects can be achieved by using a curable composition which includes a compound having a predetermined structure described later, thereby completing the present invention. The present invention provides the following.

<1> A curable composition comprising:
a compound represented by Formula (1) or Formula (2);
a curable compound; and
a solvent,

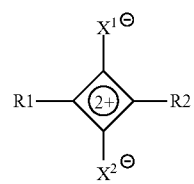

(1)

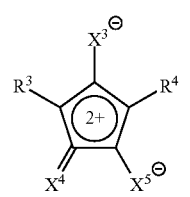

(2)

in Formula (1), $X^1$ and $X^2$ each independently represent O, S, or a dicyanomethylene group, and $R^1$ and $R^2$ each independently represent an aryl group, a heterocyclic group, a group represented by Formula (R1), or a group represented by Formula (R2), in which at least one of $R^1$ or $R^2$ is the group represented by Formula (R2), in Formula (2), $X^3$ to $X^5$ each independently represent O, S, or a dicyanomethylene group, and $R^3$ and $R^4$ each independently represent an aryl group, a heterocyclic group, the group represented by Formula (R1), or the group represented by Formula (R2), in which at least one of $R^3$ or $R^4$ is the group represented by Formula (R2),

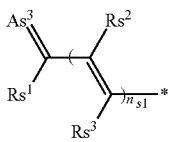
(R1)

in Formula (R1), * represents a bonding hand, $Rs^1$ to $Rs^3$ each independently represent a hydrogen atom or an alkyl group, $As^3$ represents a heterocyclic group, and $n_{s1}$ represents an integer of 0 or more, in which $Rs^1$ and $Rs^2$ may be bonded to each other to form a ring, $Rs^1$ and $As^3$ may be bonded to each other to form a ring, $Rs^2$ and $Rs^3$ may be bonded to each other to form a ring, and in a case where $n_{s1}$ is 2 or more, a plurality of $Rs^2$'s and $Rs^3$'s may be the same or different from each other,

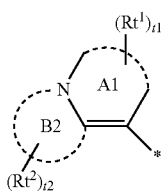
(R2)

in Formula (R2), * represents a bonding hand, $Rt^1$ and $Rt^2$ each independently represent a substituent, A1 represents a 4-membered to 9-membered nitrogen-containing heterocyclic ring, B2 represents a monocyclic or fused aromatic ring, and t1 and t2 each independently represent an integer of 0 or more, in which, in a case where t1 is 2 or more, a plurality of $Rt^1$'s may be the same or different from each other and two $Rt^1$'s of the plurality of $Rt^1$'s may be bonded to each other to form a ring, and in a case where t2 is 2 or more, a plurality of $Rt^2$'s may be the same or different from each other and two $Rt^2$'s of the plurality of $Rt^2$'s may be bonded to each other to form a ring.

<2> The curable composition according to <1>, in which the group represented by Formula (R2) is a group represented by any one of Formulae (R2-1) to (R2-4),

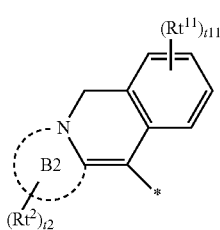
(R2-1)

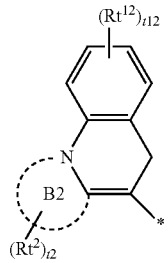
(R2-2)

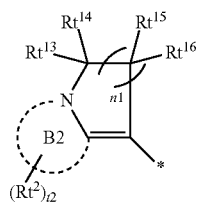
(R2-3)

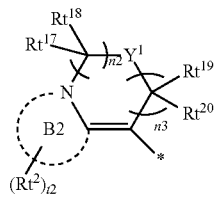
(R2-4)

in the formulae, $Rt^2$, $Rt^{11}$, and $Rt^{12}$ each independently represent a substituent, $Rt^{13}$ to $Rt^{20}$ each independently represent a hydrogen atom or a substituent, $Y^1$ represents O, S, C(=O), S(=O), or $SO_2$, B2 represents a monocyclic or fused aromatic ring, t2 represents an integer of 0 or more, in which, in a case where t2 is 2 or more, a plurality of $Rt^2$'s may be the same or different from each other and two $Rt^2$'s of the plurality of $Rt^2$'s may be bonded to each other to form a ring, t11 and t12 each independently represent an integer of 0 to 4, in which, in a case where t11 is 2 or more, a plurality of $Rt^{11}$'s may be the same or different from each other and two $Rt^{11}$'s of the plurality of $Rt^{11}$'s may be bonded to each other to form a ring, and in a case where t12 is 2 or more, a plurality of $Rt^{12}$'s may be the same or different from each other and two $Rt^{12}$'s of the plurality of $Rt^{12}$'s may be bonded to each other to form a ring, n1 represents an integer of 0 to 4, and n2 and n3 each independently represent an integer of 1 to 3, in which n2+n3 is an integer of 2 to 4.

<3> The curable composition according to <1> or <2>, in which the monocyclic or fused aromatic ring represented by B2 of Formula (R2) is an imidazole ring, an oxazole ring, a thiazole ring, a pyridine ring, a pyrazine ring, or a fused ring including one or more of these rings.

<4> The curable composition according to <1>, in which the group represented by Formula (R2) is a group represented by any one of Formulae (R2-11) to (R2-14),

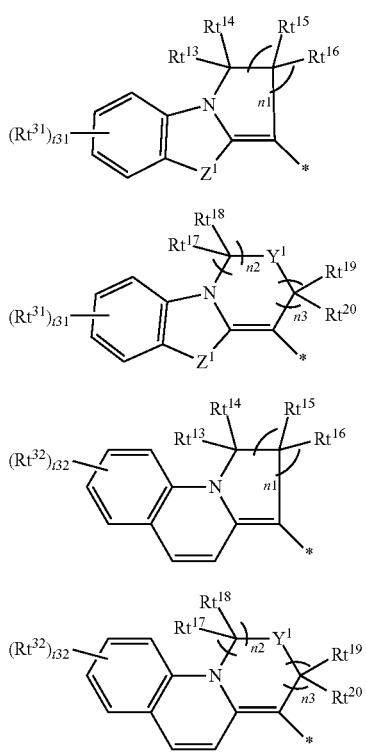

where, $Rt^{13}$ to $Rt^{20}$ each independently represent a hydrogen atom or a substituent, $Rt^{31}$ and $Rt^{32}$ each independently represent a substituent, $Y^1$ represents O, S, C(=O), S(=O), or $SO_2$, $Z^1$ represents O, S, $NR^{z1}$, or $CR^{z2}R^{z3}$, in which $R^{z1}$ to $R^{z3}$ each independently represent a hydrogen atom or a substituent, t31 represents an integer of 0 to 4, t32 represents an integer of 0 to 6, in a case where t31 is 2 or more, a plurality of $Rt^{31}$'s may be the same or different from each other and two $Rt^{31}$'s of the plurality of $Rt^{31}$'s may be bonded to each other to form a ring, in a case where t32 is 2 or more, a plurality of $Rt^{32}$'s may be the same or different from each other and two $Rt^{32}$'s of the plurality of $Rt^{32}$'s may be bonded to each other to form a ring, n1 represents an integer of 0 to 4, and n2 and n3 each independently represent an integer of 1 to 3, in which n2+n3 is an integer of 2 to 4.

<5> The curable composition according to any one of <1> to <4>, in which the compound represented by Formula (1) or Formula (2) has a maximum absorption wavelength in a wavelength range of 600 to 1300 nm in a chloroform solution.

<6> The curable composition according to any one of <1> to <5>, in which, in a case where a film having a thickness of 1.0 μm is formed using the curable composition, the film has a maximum absorption wavelength longer than a maximum absorption wavelength of the compound represented by Formula (1) or Formula (2) in a chloroform solution.

<7> The curable composition according to any one of <1> to <6>, in which, in a case where a film having a thickness of 1.0 μm is formed using the curable composition, the film has a maximum absorption wavelength in a range of 700 to 1400 nm.

<8> A film which is formed from the curable composition according to any one of <1> to <7>.

<9> A near-infrared cut filter comprising:

the film according to <8>.

<10> A solid-state imaging element comprising:

the film according to <8>.

<11> An image display device comprising:

the film according to <8>.

<12> An infrared sensor comprising:

the film according to <8>.

<13> A camera module comprising:

a solid-state imaging element; and the near-infrared cut filter according to <9>.

According to the present invention, it is possible to provide a curable composition with which a film having excellent light resistance and moisture resistance can be formed. In addition, according to the present invention, it is possible to provide a film, a near-infrared cut filter, a solid-state imaging element, an image display device, an infrared sensor, and a camera module.

BRIEF DESCRIPTION OF THE DRAWINGS

FIG. 1 is a schematic diagram indicating an embodiment of an infrared sensor.

DESCRIPTION OF THE PREFERRED EMBODIMENTS

Hereinafter, the details of the present invention will be described.

In the present specification, numerical ranges represented by "to" include numerical values before and after "to" as lower limit values and upper limit values.

In the present specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In the present specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, a weight-average molecular weight and a number-average molecular weight are defined as values in terms of polystyrene measured by gel permeation chromatography (GPC).

In the present specification, the weight-average molecular weight (Mw) and the number-average molecular weight (Mn) can be obtained, for example, by using HLC-8220 GPC (manufactured by Tosoh Corporation), using, as a column, a column connecting TOSOH TSKgel Super HZM-H, TOSOH TSKgel Super HZ4000, and TOSOH TSKgel Super HZ2000, and using tetrahydrofuran as a developing solvent.

In the present specification, in a chemical formula, Me represents a methyl group, Et represents an ethyl group, Bu represents a butyl group, and Ph represents a phenyl group.

In the present specification, near infrared light denotes light (electromagnetic wave) having a wavelength in a range of 700 to 2500 nm.

In the present specification, a total solid content denotes the total mass of all the components of the composition excluding a solvent.

In the present specification, the term "step" denotes not only an individual step but also a step which is not clearly distinguishable from another step as long as an effect expected from the step can be achieved.

<Curable Composition>

The curable composition according to an embodiment of the present invention includes a compound represented by Formula (1) or Formula (2) described later, a curable compound, a solvent. Hereinafter, the compound represented by Formula (1) is also referred to as a compound (1). In addition, the compound represented by Formula (2) is also referred to as a compound (2). In addition, the compound (1) and the compound (2) are collectively referred to as a compound A.

By using the curable composition according to the embodiment of the present invention, a film having excellent light resistance and moisture resistance can be formed. The mechanism for obtaining such an effect is assumed as follows.

Since the compound A has a group represented by Formula (R2) described later, it is assumed that steric hindrance increases at a vicinity of a partial structure represented by Formula (1-a) in the compound (1), or at a vicinity of a partial structure represented by Formula (2-a) in the compound (2). As a result, it is assumed that the compound A is less likely to be hydrolyzed and excellent moisture resistance is obtained.

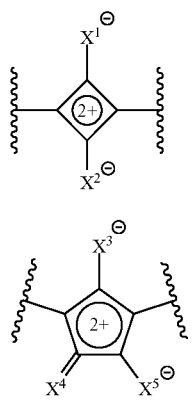

(1-a)

(2-a)

In addition, the compound A has a structure in which the group represented by Formula (R2) is projected to a plane of coloring agent (a site of Formula (1-a) in the compound (1) or a site of Formula (2-a) in the compound (2)). Therefore, in a case of film formation, it is assumed that the compounds A tend to be displaced and overlapped with each other so as to avoid steric hindrance and the J-association sequence of the compounds A in the film is stabilized. Accordingly, it is assumed that excellent light resistance is obtained.

In addition, since the J-association sequence of the compounds A in the film is stabilized, it is possible to shift the maximum absorption wavelength to a longer wavelength side so as to have absorption in the longer wavelength side. Therefore, by containing the compound A in the curable compound, a film having excellent spectral characteristics (for example, a film having excellent spectral characteristics of near-infrared shielding properties and visible transparency) can be formed. In addition, since the compound A has the group represented by Formula (R2), which is a group having high steric hindrance, it is possible to suppress coarsening of particles due to aggregation of the compounds A in a case of film formation, and as a result, a film having more excellent visible transparency can be formed.

In Examples of JP2016-074649A, a compound of the following structure, and the like are disclosed, but according to the studies of the present inventor, in a case of using the compound disclosed in JP2016-074649A, it is assumed that it is difficult to obtain sufficient light resistance. In the compound disclosed in JP2016-074649A, it is assumed that hydrogen bonds are easily formed at a site surrounded by the broken line in the following structural formula. Since the compound has such a hydrogen bonding site, it is assumed that the compound easily interacts with a solvent or curable compound in the curable composition, the association formation of the compounds is inhibited in a case of film formation, and it is difficult to form a J-aggregate.

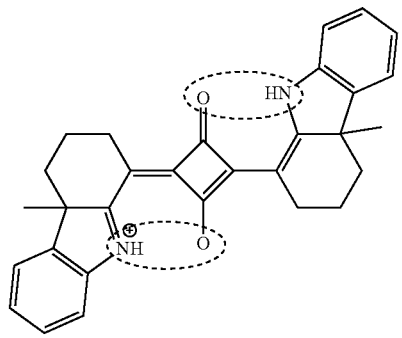 [SMILES: CC12CCCC(C3=C(O)/C(=C4/CCCC5(C)C4=[NH+]c4ccccc45)C3=O)=C1Nc1ccccc12]

Hereinafter, respective components of the curable composition according to the embodiment of the present invention will be described.

<<Compound A>>

The curable composition according to the embodiment of the present invention includes a compound (compound A) represented by Formula (1) or Formula (2). The compound A is preferably used as a near-infrared absorber.

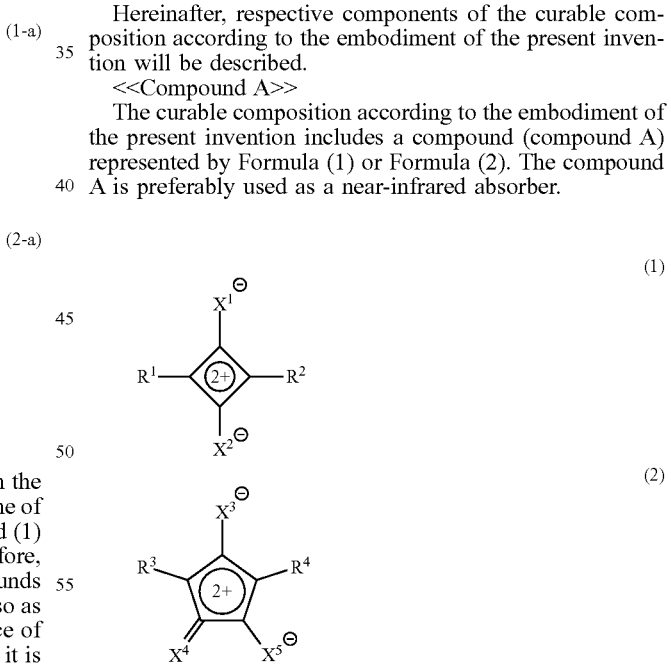

In Formula (1), $X^1$ and $X^2$ each independently represent O, S, or a dicyanomethylene group, and $R^1$ and $R^2$ each independently represent an aryl group, a heterocyclic group, a group represented by Formula (R1), or a group represented by Formula (R2), in which at least one of $R^1$ or $R^2$ is the group represented by Formula (R2); and in Formula (2), $X^3$ to $X^5$ each independently represent O, S, or a dicyanomethylene group, and $R^3$ and $R^4$ each independently represent an aryl group, a heterocyclic group, the group represented by Formula (R1), or the group represented by Formula (R2), in which at least one of $R^3$ or $R^4$ is the group represented by Formula (R2).

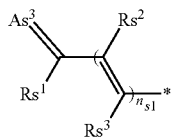

(R1)

In Formula (R1), * represents a bonding hand, $Rs^1$ to $Rs^3$ each independently represent a hydrogen atom or an alkyl group, $As^3$ represents a heterocyclic group, and $n_{s1}$ represents an integer of 0 or more, in which $Rs^1$ and $Rs^1$ may be bonded to each other to form a ring, $Rs^1$ and $As^3$ may be bonded to each other to form a ring, $Rs^1$ and $Rs^3$ may be bonded to each other to form a ring, and in a case where $n_{s1}$ is 2 or more, a plurality of $Rs^2$s and $Rs^3$'s may be the same or different from each other.

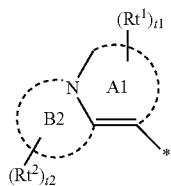

(R2)

In Formula (R2), * represents a bonding hand, $Rt^1$ and $Rt^2$ each independently represent a substituent, A1 represents a 4-membered to 9-membered nitrogen-containing heterocyclic ring, B2 represents a monocyclic or fused aromatic ring, and t1 and t2 each independently represent an integer of 0 or more, in which, in a case where t1 is 2 or more, a plurality of $Rt^1$'s may be the same or different from each other and two $Rt^1$'s of the plurality of $Rt^1$'s may be bonded to each other to form a ring, and in a case where t2 is 2 or more, a plurality of $Rt^1$'s may be the same or different from each other and two $Rt^2$'s of the plurality of $Rt^2$'s may be bonded to each other to form a ring.

The compound A (compound represented by Formula (1) or Formula (2)) is preferably a compound having a maximum absorption wavelength in a wavelength range of 600 to 1300 nm in a chloroform solution, more preferably a compound having the maximum absorption wavelength in a wavelength range of 650 to 1200 nm, and still more preferably a compound having the maximum absorption wavelength in a wavelength range of 700 to 1100 nm. The maximum absorption wavelength of the compound A in a chloroform solution can be obtained by preparing a chloroform solution of the compound A and measuring the absorbance of this chloroform solution.

As shown below, cations in Formula (1) are present without being localized.

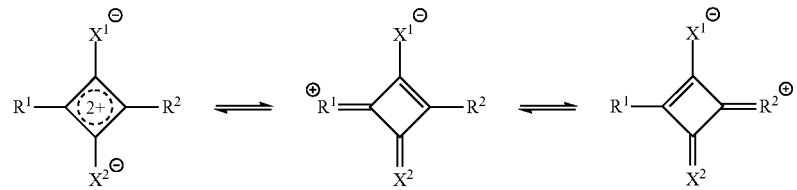

For example, cations in a compound I-1 are present without being localized as shown below.

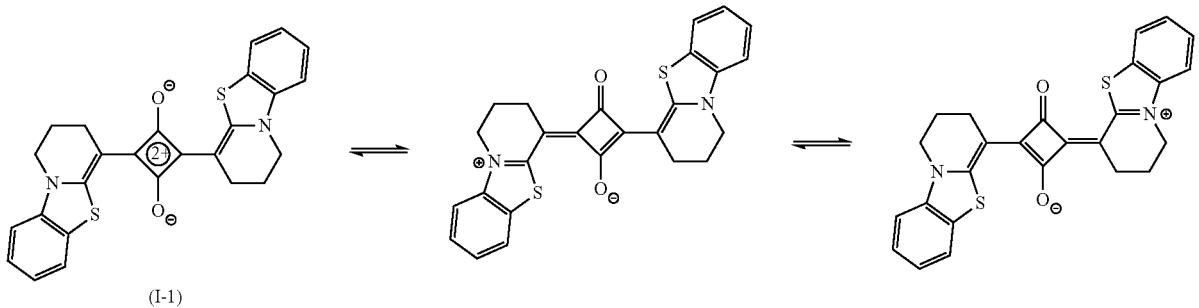

(I-1)

In addition, cations in Formula (2) are present without being localized as shown below.

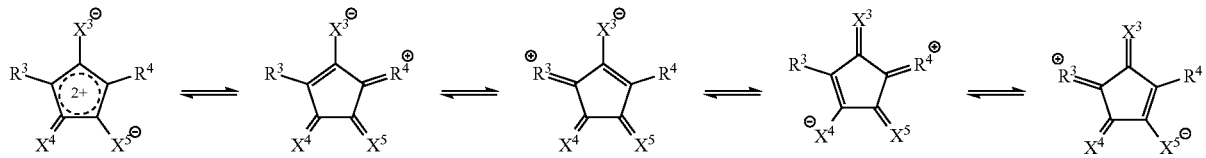

First, the compound (1) (compound represented by Formula (1)) will be described.

In Formula (1), $X^1$ and $X^2$ each independently represent O, S, or a dicyanomethylene group, and O is preferable.

In Formula (1), $R^1$ and $R^2$ each independently represent an aryl group, a heterocyclic group, a group represented by Formula (R1), or a group represented by Formula (R2), in which at least one of $R^1$ or $R^2$ is the group represented by Formula (R2), and from the reason that the effects of the present invention are more significantly and easily obtained, it is preferable that both of $R^1$ and $R^2$ are the group represented by Formula (R2).

The number of carbon atoms in the aryl group represented by $R^1$ and $R^2$ is preferably 6 to 48, more preferably 6 to 22, and particularly preferably 6 to 12. The heterocyclic group represented by $R^1$ and $R^2$ is preferably a 5-membered or 6-membered heterocyclic group. In addition, as the heterocyclic group, a heterocyclic group of a monocyclic ring or a fused ring composed of 2 to 8 rings is preferable, a heterocyclic group of a monocyclic ring or a fused ring composed of 2 to 4 rings is more preferable, a heterocyclic group of a monocyclic ring or a fused ring composed of 2 or 3 rings is still more preferable, and a heterocyclic group of a monocyclic ring or a fused ring composed of 2 rings is particularly preferable. Examples of a heteroatom constituting the ring of the heterocyclic group include a nitrogen atom, an oxygen atom, and a sulfur atom, and a nitrogen atom or a sulfur atom is preferable. The number of heteroatoms constituting a ring of the heterocyclic group is preferably 1 to 3 and more preferably 1 or 2.

In Formula (R1), $Rs^1$ to $Rs^3$ each independently represent a hydrogen atom or an alkyl group. The number of carbon atoms in the alkyl group represented by $Rs^1$ to $Rs^3$ is preferably 1 to 20, more preferably 1 to 15, and still more preferably 1 to 8. The alkyl group may be linear, branched, or cyclic, and is preferably linear or branched. $Rs^1$ to $Rs^3$ are preferably hydrogen atoms. In Formula (R1), $As^3$ represents a heterocyclic group. Examples of the heterocyclic group represented by $As^3$ include the heterocyclic groups described in the section of $R^1$ and $R^2$, and the preferred range is also the same.

In Formula (R1), $n_{s1}$ represents an integer of 0 or more. $n_{s1}$ is preferably an integer of 0 to 2, more preferably 0 or 1, and still more preferably 0.

In Formula (R1), $Rs^1$ and $Rs^2$ may be bonded to each other to form a ring, $Rs^1$ and $As^3$ may be bonded to each other to form a ring, and $Rs^2$ and $Rs^3$ may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group may be unsubstituted or may have a substituent. Examples of the substituent include the substituent T described later and the solubilizing group described later.

In Formula (R1), in a case where $n_{s1}$ is 2 or more, a plurality of $Rs^2$'s and $Rs^3$'s may be the same or different from each other.

Next, Formula (R2) will be described.

In Formula (R2), $Rt^1$ and $Rt^2$ each independently represent a substituent. Examples of the substituent include the substituent T described later and the solubilizing group described later.

In Formula (R2), t1 and t2 each independently represent an integer of 0 or more. In a case where t1 is 2 or more, a plurality of $Rt^1$'s may be the same or different from each other and two $Rt^1$'s of the plurality of $Rt^1$'s may be bonded to each other to form a ring, and in a case where t2 is 2 or more, a plurality of $Rt^2$'s may be the same or different from each other and two $Rt^2$'s of the plurality of $Rt^2$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the substituent T described later and the solubilizing group described later.

In Formula (R2), the nitrogen-containing heterocyclic ring represented A1 is preferably a 5-membered to 7-membered ring and more preferably a 5-membered or 6-membered ring.

In Formula (R2), B2 represents a monocyclic or fused aromatic ring, and an imidazole ring, an oxazole ring, a thiazole ring, a pyridine ring, a pyrazine ring, or a fused ring including one or more of these rings is preferable. Examples of the above-described fused ring include a fused ring of at least one ring selected from an imidazole ring, an oxazole ring, a thiazole ring, a pyridine ring, and a pyrazine ring, and a benzene ring or a naphthalene ring; and a fused ring of two or more rings selected from an imidazole ring, an oxazole ring, a thiazole ring, a pyridine ring, and a pyrazine ring. From the reason that more excellent spectral characteristics are easily obtained, the fused number of the fused ring is preferably 2 to 6 and more preferably 2 to 4.

In the present invention, the group represented by Formula (R2) is preferably a group represented by any one of Formulae (R2-1) to (R2-4). From the reason that light resistance is excellent, a group represented by Formula (R2-3) or Formula (R2-4) is more preferable, and from the reason that light resistance and moisture resistance is excellent, a group represented by Formula (R2-3) is still more preferable.

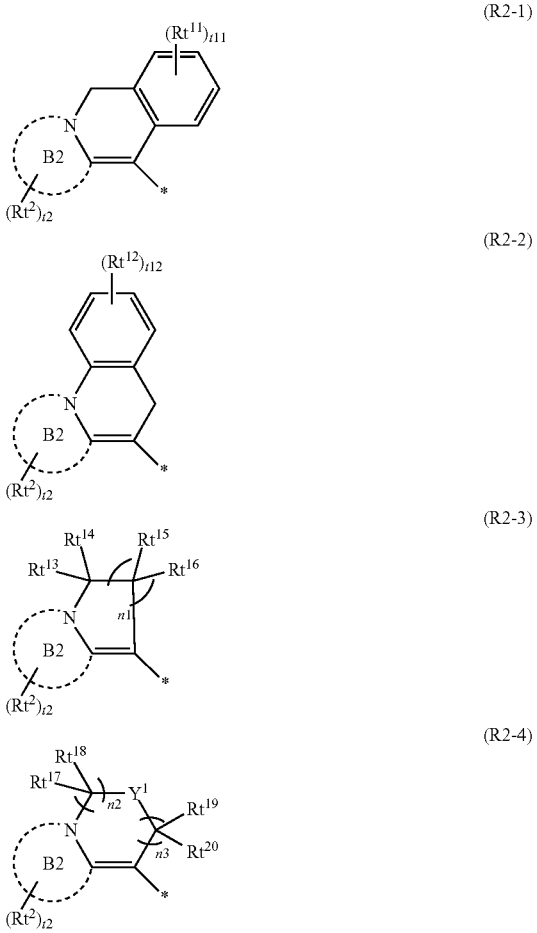

In the formulae, $Rt^2$, $Rt^{11}$, and $Rt^{12}$ each independently represent a substituent, $Rt^{13}$ to $Rt^{20}$ each independently represent a hydrogen atom or a substituent, $Y^1$ represents O, S, C(=O), S(=O), or $SO_2$, B2 represents a monocyclic or fused aromatic ring, t2 represents an integer of 0 or more, in which, in a case where t2 is 2 or more, a plurality of $Rt^2$'s may be the same or different from each other and two $Rt^2$'s of the plurality of $Rt^2$'s may be bonded to each other to form a ring, t11 and t12 each independently represent an integer of 0 to 4, in which, in a case where t11 is 2 or more, a plurality of $Rt^{11}$'s may be the same or different from each other and two $Rt^{11}$'s of the plurality of $Rt^{11}$'s may be bonded to each other to form a ring, and in a case where t12 is 2 or more, a plurality of $Rt^{12}$'s may be the same or different from each other and two $Rt^{12}$'s of the plurality of $Rt^{12}$'s may be bonded to each other to form a ring, n1 represents an integer of 0 to 4, and n2 and n3 each independently represent an integer of 1 to 3, in which n2+n3 is an integer of 2 to 4.

Examples of the substituent represented by $Rt^2$, and $Rt^{11}$ to $Rt^{20}$ in the above formulae include the substituent T described later and the solubilizing group described later. The substituent represented by $Rt^{13}$ to $Rt^{20}$ is preferably an alkyl group.

In the formulae, $Y^1$ represents O, S, C(=O), S(=O), or $SO_2$, and O or C(=O) is preferable.

In the formulae, B2 represents a monocyclic or fused aromatic ring. B2 has the same meaning as B2 in Formula (R2), and the preferred range is also the same.

In the formulae, t2 represents an integer of 0 or more, in which, in a case where t2 is 2 or more, a plurality of $Rt^2$'s may be the same or different from each other and two $Rt^2$'s of the plurality of $Rt^2$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the substituent T described later and the solubilizing group described later.

In the formulae, t11 and t12 each independently represent an integer of 0 to 4, and is preferably an integer of 0 to 3, more preferably an integer of 0 to 2, and still more preferably 0 or 1. In a case where t11 is 2 or more, a plurality of $Rt^{11}$'s may be the same or different from each other and two $Rt^{11}$'s of the plurality of $Rt^{11}$'s may be bonded to each other to form a ring, and in a case where t12 is 2 or more, a plurality of $Rt^{12}$'s may be the same or different from each other and two $Rt^{12}$'s of the plurality of $Rt^{12}$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the substituent T described later and the solubilizing group described later.

In the formulae, n1 represents an integer of 0 to 4, and n2 and n3 each independently represent an integer of 1 to 3, in which n2+n3 is an integer of 2 to 4. n1 is preferably an integer of 1 to 4, more preferably an integer of 1 to 3, and still more preferably 1 or 2. n2 and n3 each independently represent an integer of 1 to 3, and 1 or 2 is more preferable and 1 is still more preferable.

In the present invention, the group represented by Formula (R2) is more preferably a group represented by any one of Formulae (R2-11) to (R2-14). A group represented any one of Formula (R2-11) or (R2-13) is more preferable. According to this aspect, an effect of excellent moisture resistance can be expected. In addition, in a case of a group represented by Formula (R2-11), an effect of excellent light resistance can also be expected. In addition, in a case of a group represented by Formula (R2-13), an effect of excellent spectral characteristics can also be expected.

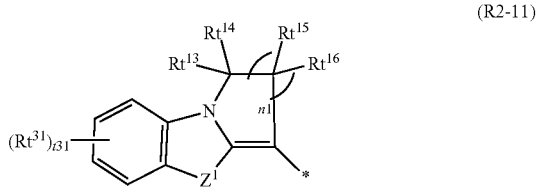

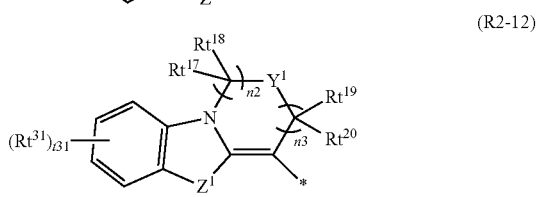

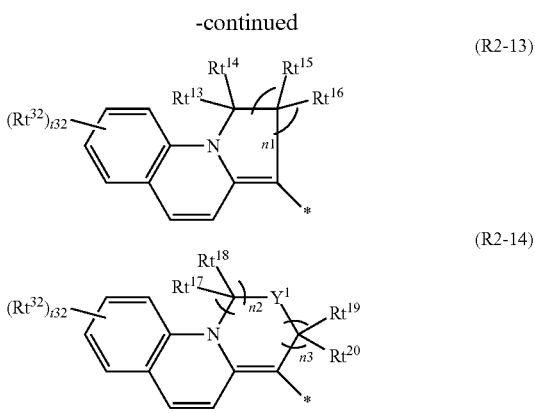

(R2-13)

(R2-14)

$Rt^{13}$ to $Rt^{20}$ each independently represent a hydrogen atom or a substituent, $Rt^{31}$ and $Rt^{32}$ each independently represent a substituent, $Y^1$ represents O, S, C(=O), S(=O), or $SO_2$, $Z^1$ represents O, S, $NR^{z1}$, or $CR^{z2}R^{z3}$, in which $R^{z1}$ to $R^{z3}$ each independently represent a hydrogen atom or a substituent, t31 represents an integer of 0 to 4, t32 represents an integer of 0 to 6, in a case where t31 is 2 or more, a plurality of $Rt^{31}$'s may be the same or different from each other and two $Rt^{31}$'s of the plurality of $Rt^{31}$'s may be bonded to each other to form a ring, in a case where t32 is 2 or more, a plurality of $Rt^{32}$'s may be the same or different from each other and two $Rt^{32}$'s of the plurality of $Rt^{32}$'s may be bonded to each other to form a ring, n1 represents an integer of 0 to 4, and n2 and n3 each independently represent an integer of 1 to 3, in which n2+n3 is an integer of 2 to 4.

Examples of the substituent represented by $Rt^{13}$ to $Rt^{20}$, $Rt^{31}$, and $Rt^{32}$ in the above formulae include the substituent T described later and the solubilizing group described later. The substituent represented by $Rt^{13}$ to $Rt^{20}$ is preferably an alkyl group.

In the formulae, $Y^1$ represents O, S, C(=O), S(=O), or $SO_2$, and O or C(=O) is preferable.

$Z^1$ represents O, S, $NR^{z1}$, or $CR^{z2}R^{z3}$, in which $R^{z1}$ to $R^{z3}$ each independently represent a hydrogen atom or a substituent. $Z^1$ is preferably O, S, or $NR^{z1}$, and from the reason that more excellent light resistance is easily obtained, O or S is more preferable. Examples of the substituent represented by $R^{z1}$ to $R^{z3}$ include the substituent T and the solubilizing group described later. $R^{z1}$ to $R^{z3}$ are preferably a hydrogen atom, an alkyl group, or the solubilizing group described later.

t31 represents an integer of 0 to 4, and is preferably an integer of 0 to 3, more preferably an integer of 0 to 2, and still more preferably 0 or 1. t32 represents an integer of 0 to 6, and is preferably an integer of 0 to 5, more preferably an integer of 0 to 4, still more preferably an integer of 0 or 3, even more preferably an integer of 0 to 2, and particularly preferably 0 or 1. In a case where t31 is 2 or more, a plurality of $Rt^{31}$'s may be the same or different from each other and two $Rt^{31}$'s of the plurality of $Rt^{31}$'s may be bonded to each other to form a ring, and in a case where t32 is 2 or more, a plurality of $Rt^{32}$'s may be the same or different from each other and two $Rt^{32}$'s of the plurality of $Rt^{32}$'s may be bonded to each other to form a ring. As a linking group in a case of forming the above-described ring, —CO—, —O—, —NH—, an alkylene group having 1 to 10 carbon atoms, or a divalent linking group selected from a group consisting of a combination thereof is preferable. The alkylene group as the linking group may be unsubstituted or may have a substituent. Examples of the substituent include the substituent T described later and the solubilizing group described later.

(Substituent T)

Examples of a substituent T include a halogen atom, a cyano group, a nitro group, an alkyl group, an alkenyl group, an alkynyl group, an aryl group, a heteroaryl group, $—ORt^1$, $—CORt^1$, $—COORt^1$, $—OCORt^1$, $—NRt^1Rt^2$, $—NHCORt^1$, $—CONRt^1Rt^2$, $—NHCONRt^1Rt^2$, $—NHCOORt^1$, $—SRt^1$, $—SO_2Rt^1$, $—SO_2ORt^1$, $—NHSO_2Rt^1$, and $—SO_2NRt^1Rt^2$. $Rt^1$ and $Rt^2$ each independently represent a hydrogen atom, an alkyl group, an alkenyl group, an alkynyl group, an aryl group, or a heteroaryl group. $Rt^1$ and $Rt^2$ may be bonded to each other to form a ring.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic, and is preferably linear or branched.

The number of carbon atoms in the alkenyl group is preferably 2 to 20, more preferably 2 to 12, and particularly preferably 2 to 8. The alkenyl group may be linear, branched, or cyclic, and is preferably linear or branched.

The number of carbon atoms in the alkynyl group is preferably 2 to 40, more preferably 2 to 30, and particularly preferably 2 to 25. The alkynyl group may be linear, branched, or cyclic, and is preferably linear or branched.

The number of carbon atoms in the aryl group is preferably 6 to 30, more preferably 6 to 20, and still more preferably 6 to 12.

As the heteroaryl group, a heteroaryl group of a monocyclic ring or a fused ring composed of 2 to 8 rings is preferable, and a heteroaryl group of a monocyclic ring or a fused ring composed of 2 to 4 rings is more preferable. The number of heteroatoms constituting a ring of the heteroaryl group is preferably 1 to 3. As the heteroatom constituting the ring of the heteroaryl group, a nitrogen atom, an oxygen atom, or a sulfur atom is preferable. It is preferable that the heteroaryl group is a 5-membered or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aryl group, and the heteroaryl group may have a substituent or may be unsubstituted. Examples of the substituent include the substituents described in the substituent T.

(Solubilizing Group)

Examples of a solubilizing group include a group represented Formula (W).

$$—S^{100}\text{-}L^{100}\text{-}T^{100} \quad (W)$$

In Formula (W), $S^{100}$ represents a single bond, an arylene group, or a heteroarylene group, and a single bond is preferable. The arylene group may be a monocyclic or a polycyclic, but is preferably monocyclic. The number of carbon atoms in the arylene group is preferably 6 to 20 and more preferably 6 to 12. The heteroarylene group may be a monocyclic or a polycyclic, but is preferably monocyclic. The number of heteroatoms constituting a ring of the heteroarylene group is preferably 1 to 3. As the heteroatom constituting the ring of the heteroarylene group, a nitrogen atom, an oxygen atom, a sulfur atom, or a selenium atom is preferable. The number of carbon atoms constituting the ring of the heteroarylene group is preferably 3 to 30, more preferably 3 to 18, and still more preferably 3 to 12.

In Formula (W), $L^{100}$ represents an alkylene group, an alkenylene group, an alkynylene group, —O—, —S—, —NR$^{L1}$—, —CO—, —COO—, —OCO—, —CONR$^{L1}$—, —NR$^{L1}$CO—, —SO$_2$—, —OR$^{L2}$—, and a group of a combination of these groups, in which R$^{L1}$ represents a hydrogen atom or an alkyl group and R$^{L2}$ represents an alkylene group. $L^{100}$ is preferably an alkylene group, an alkenylene group, an alkynylene group, —O—, —S—, —NR$^{L1}$—, —COO—, —OCO—, —CONR$^{L1}$—, —SO$_2$—, —OR$^{L2}$—, or a group of a combination of these groups, and from the viewpoint of flexibility and solvent solubility, more preferably an alkylene group, an alkenylene group, —O—, —OR$^{L2}$—, or a group of a combination of these groups, still more preferably an alkylene group, an alkenylene group, —O—, or —OR$^{L2}$—, and particularly preferably an alkylene group, —O—, or —OR$^{L2}$—.

The number of carbon atoms in the alkylene group represented by $L^{100}$ is preferably 1 to 40. The lower limit is more preferably 3 or more, still more preferably 5 or more, even more preferably 10 or more, and particularly preferably 13 or more. The upper limit is more preferably 35 or less and still more preferably 30 or less. The alkylene group may be linear, branched, or cyclic, but is preferably a linear or branched alkylene group and particularly preferably a branched alkylene group. The number of branches in the alkylene group is, for example, preferably 2 to 10 and more preferably 2 to 8. In a case where the number of branches is within the above-described range, solvent solubility is good. The number of carbon atoms in the alkenylene group and alkynylene group represented by $L^{100}$ is preferably 2 to 40. The lower limit is, for example, more preferably 3 or more, still more preferably 5 or more, even more preferably 8 or more, and particularly preferably 10 or more. The upper limit is more preferably 35 or less and still more preferably 30 or less. The alkenylene group and alkynylene group may be linear or branched, but is preferably linear or branched and particularly preferably branched. The number of branches is preferably 2 to 10 and more preferably 2 to 8. In a case where the number of branches is within the above-described range, solvent solubility is good.

$R^{L1}$ represents a hydrogen atom or an alkyl group, and a hydrogen atom is preferable. The number of carbon atoms in the alkyl group is preferably 1 to 20, more preferably 1 to 10, still more preferably 1 to 4, and particularly preferably 1 or 2. The alkyl group may be linear or branched.

$R^{L2}$ represents an alkylene group. The alkylene group represented by $R^{L2}$ has the same meaning as the alkylene group described in $L^{100}$, and the preferred range is also the same.

In Formula (W), $T^{100}$ represents an alkyl group, a cyano group, a hydroxy group, a formyl group, a carboxyl group, an amino group, a thiol group, a sulfo group, a phosphoryl group, a boryl group, a vinyl group, an ethynyl group, an aryl group, a heteroaryl group, a trialkylsilyl group, or a trialkoxysilyl group. The number of carbon atoms in the alkyl group, an alkyl group of the trialkylsilyl group, and an alkyl group of the trialkoxysilyl group is preferably 1 to 40. The lower limit is more preferably 3 or more, still more preferably 5 or more, even more preferably 10 or more, and particularly preferably 13 or more. The upper limit is more preferably 35 or less and still more preferably 30 or less. The alkyl group may be linear, branched, or cyclic, and is preferably linear or branched. The aryl group and the heteroaryl group have the same meanings as the aryl group and the heteroaryl group described in Rt$^1$ and Rt$^2$, and the preferred ranges are also the same.

In Formula (W), in a case where $S^{100}$ is a single bond, $L^{100}$ is an alkylene group, and $T^{100}$ is an alkyl group, the sum total of the number of carbon atoms included in $L^{100}$ and $T^{100}$ is preferably 3 or more, from the viewpoint of solvent solubility, more preferably 6 or more, and still more preferably 8 or more. The upper limit is, for example, preferably 40 or less and more preferably 35 or less. In addition, in a case where $S^{100}$ is an arylene group or a heteroarylene group, the sum total of the number of carbon atoms included in $L^{100}$ and $T^{100}$ is preferably 3 or more, from the viewpoint of solvent solubility, more preferably 6 or more, and still more preferably 8 or more. The upper limit is, for example, preferably 40 or less and more preferably 35 or less.

In a case where the number of carbon atoms in the -$L^{100}$-$T^{100}$ portion is 3 or more, solvent solubility is good, and it is possible to suppress the generation of defects derived from insoluble matters and the like, and manufacture a uniform film having good film quality. Furthermore, in a case where the number of carbon atoms in the -$L^{100}$-$T^{100}$ portion is 3 or more, crystallinity can be suppressed. In general, in a case where crystallinity of a compound is high, the crystallization of the compound may proceed in a case of heating a film and absorption characteristics of the film may be changed, but in the present invention, the crystallization of the compound in a case of heating can be suppressed and fluctuation in absorption characteristics of the film after heating can be suppressed.

Examples of a preferred aspect of Formula (W) include a combination in which $S^{100}$ is a single bond, $L^{100}$ is an alkylene group, an alkenylene group, an alkynylene group, —O—, —S—, —NR$^{L1}$—, —COO—, —OCO—, —CONR$^{L1}$—, —SO$_2$—, —OR$^{L2}$—, or a group of a combination of these groups, and $T^{100}$ is an alkyl group or a trialkylsilyl group. $L^{100}$ is more preferably an alkylene group, an alkenylene group, —O—, —OR$^{L2}$—, or a group of a combination of these groups, still more preferably an alkylene group, an alkenylene group, —O—, or —OR$^{L2}$—, and particularly preferably an alkylene group, —O—, or —OR$^{L2}$—. $T^{100}$ is more preferably an alkyl group.

In Formula (W), the -$L^{100}$-$T^{100}$ portion preferably includes a branched alkyl structure. Specifically, the -$L^{100}$-$T^{100}$ portion is particularly preferably a branched alkyl group or a branched alkoxy group. The number of branches in the -$L^{100}$-$T^{100}$ portion is preferably 2 to 10 and more preferably 2 to 8. The number of carbon atoms in the -$L^{100}$-$T^{100}$ portion is preferably 3 or more, more preferably 6 or more, and still more preferably 8 or more. The upper limit is, for example, preferably 40 or less and more preferably 35 or less.

In Formula (W), the -$L^{100}$-$T^{100}$ portion also preferably includes an asymmetric carbon atom. According to this aspect, the compound A can include a plurality of optical isomers, and as a result, solvent solubility of the compound A can be further improved. The number of asymmetric carbon atoms is preferably 1 or more. The upper limit of the asymmetric carbon atom is not particularly limited, but is preferably 4 or less.

Specific examples of the compound (1) include compounds having the following structures.
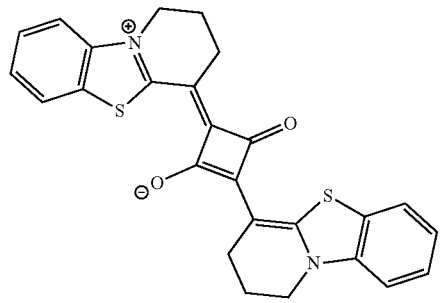
I-1
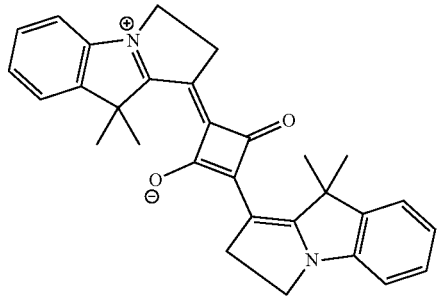
I-2
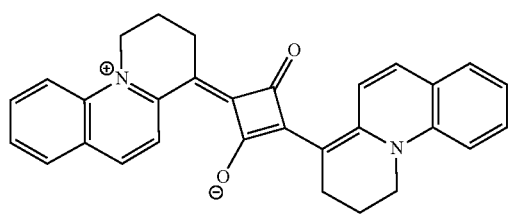
I-3
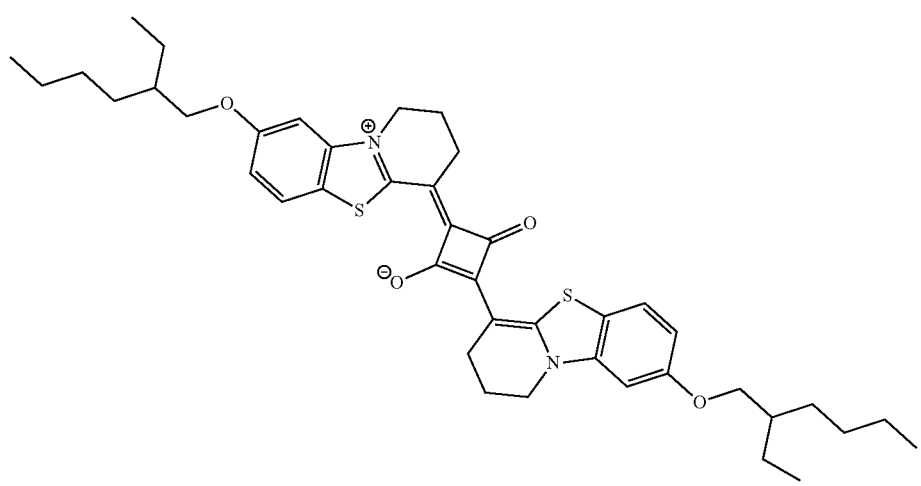
I-4
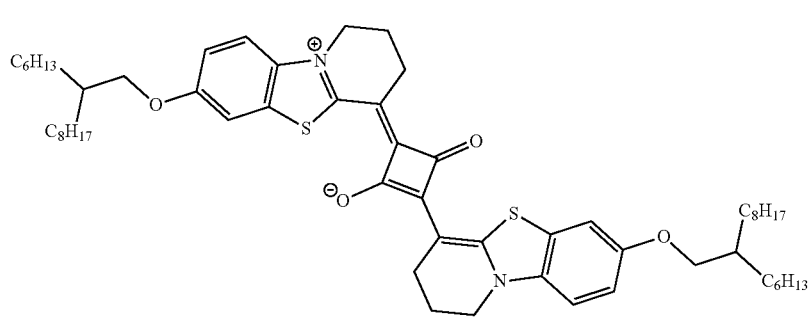
I-5

-continued
I-6
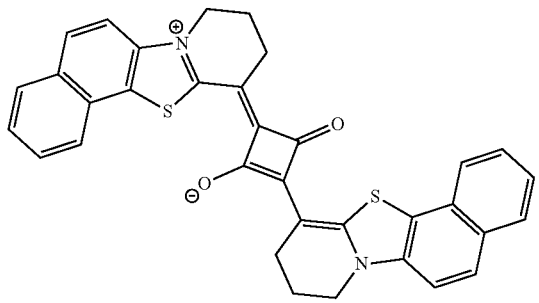
I-7
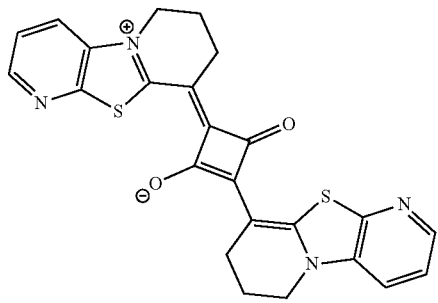
I-8
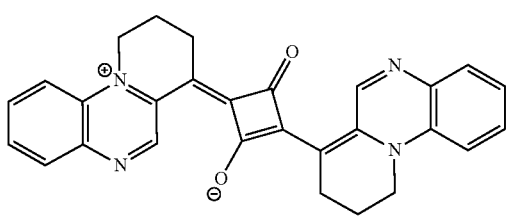
I-9
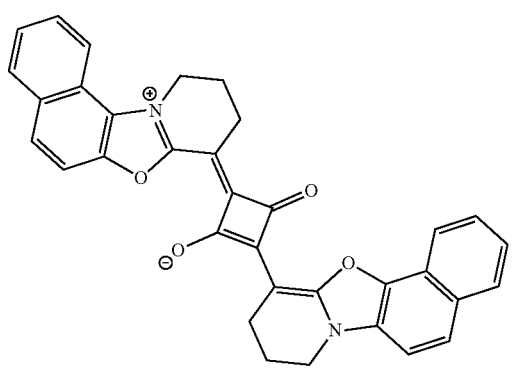
I-10
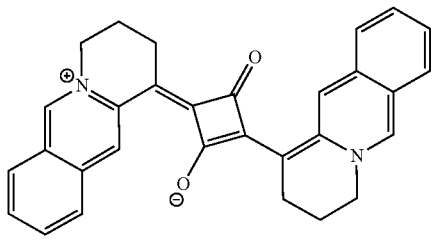
I-11
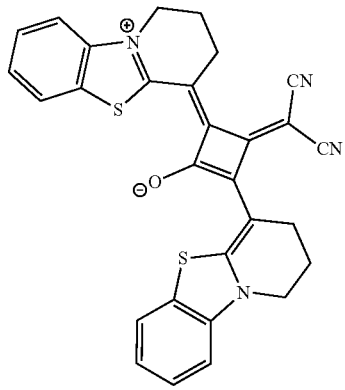
I-12
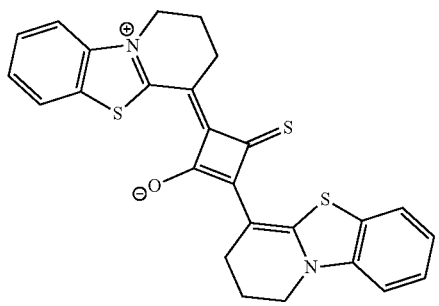
I-13
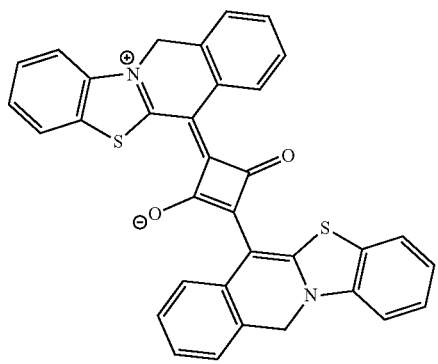

-continued
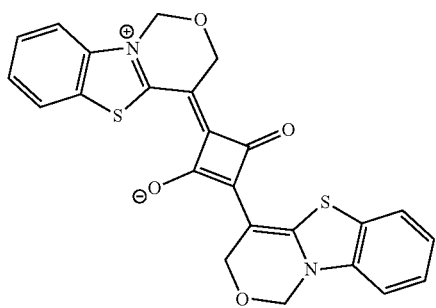
I-14
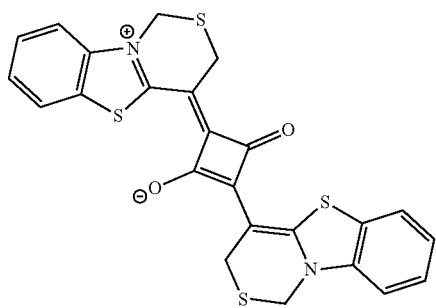
I-15
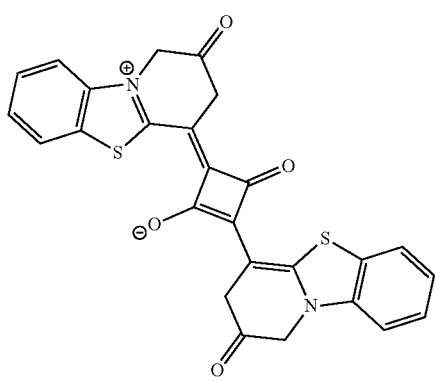
I-16
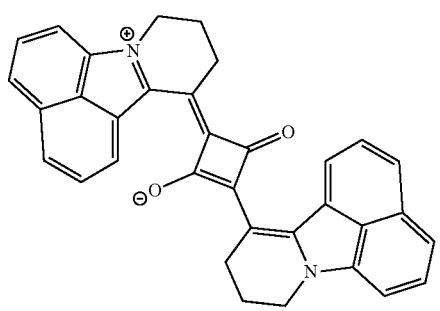
I-17
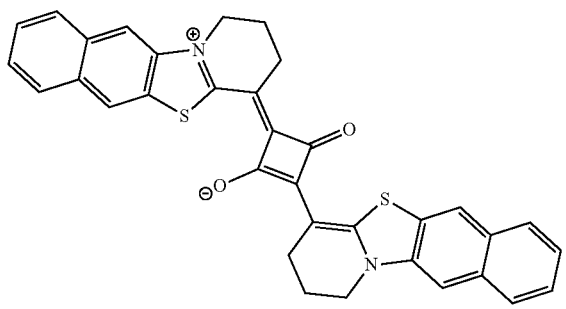
I-18
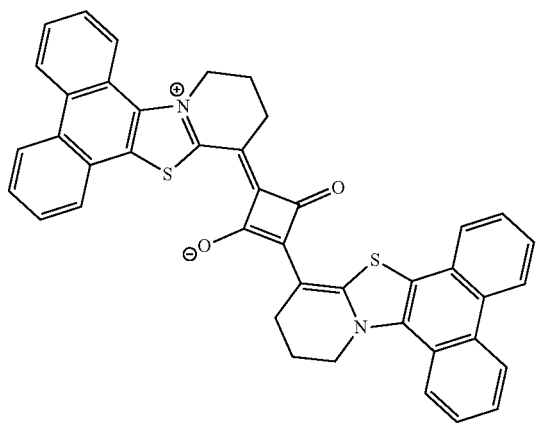
I-19
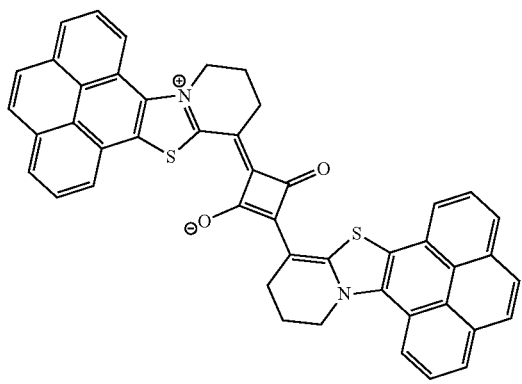
I-20
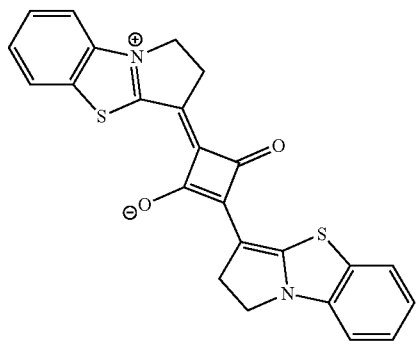
I-21

-continued
| I-22 | I-23 |
|---|---|
| 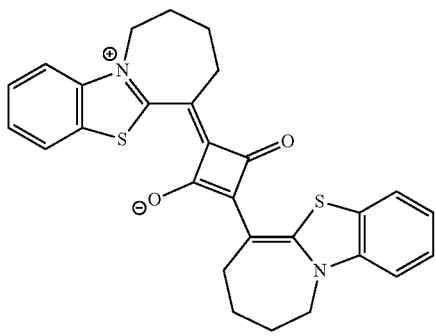 | 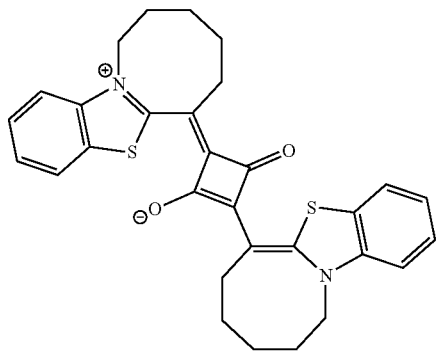 |
| I-24 | I-25 |
| 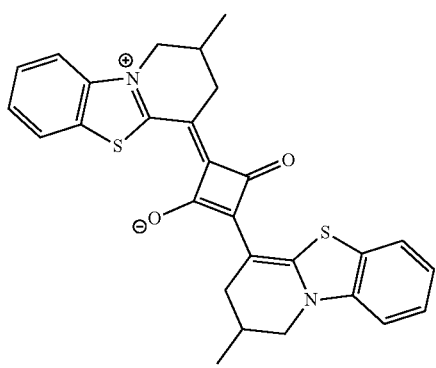 | 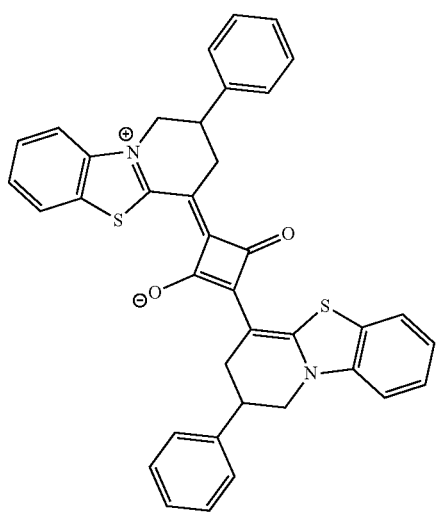 |
| I-26 | I-27 |
| 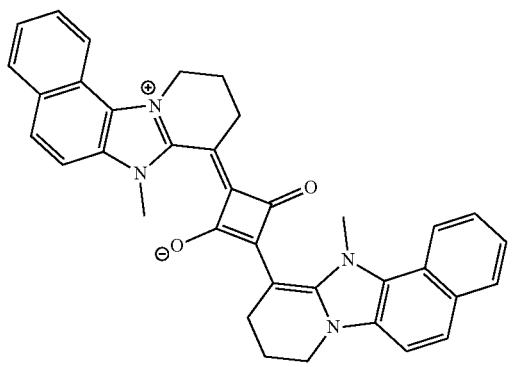 | 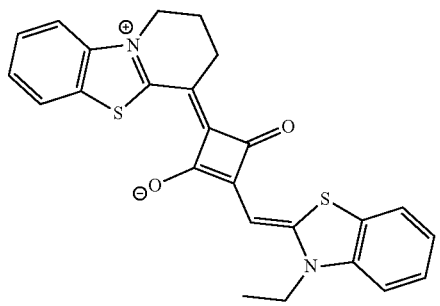 |
| I-28 | I-29 |
| 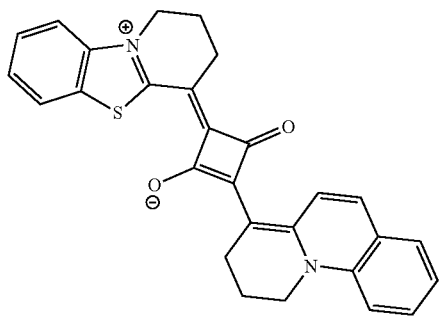 | 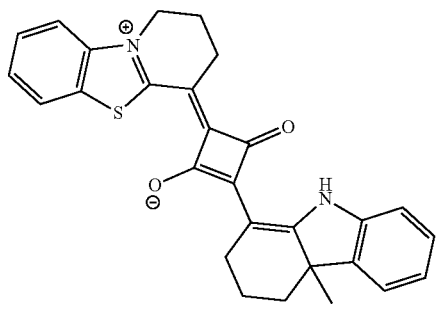 |

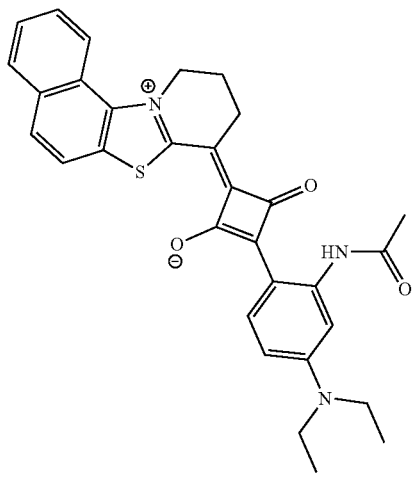

I-30

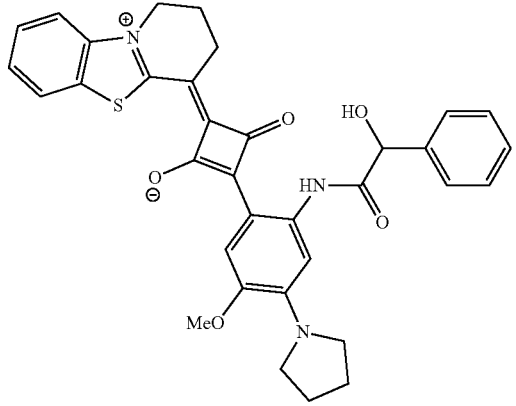

I-31

Next, the compound (2) (compound represented by Formula (2)) will be described.

In Formula (2), $X^3$ to $X^5$ each independently represent O, S, or a dicyanomethylene group, and O is preferable.

In Formula (2), $R^3$ and $R^4$ each independently represent an aryl group, a heterocyclic group, the group represented by Formula (R1), or the group represented by Formula (R2), in which at least one of $R^3$ or $R^4$ is the group represented by Formula (R2), and from the reason that the effects of the present invention are more significantly and easily obtained, it is preferable that both of $R^3$ and $R^4$ are the group represented by Formula (R2).

The aryl group, heterocyclic group, group represented by Formula (R1), and group represented by Formula (R2) represented by $R^3$ and $R^4$ is the same the range described in the section of the aryl group, heterocyclic group, group represented by Formula (R1), and group represented by Formula (R2) represented by $R^1$ and $R^2$ in Formula (1), and the preferred ranges are also the same.

Specific examples of the compound (2) include compounds having the following structures.

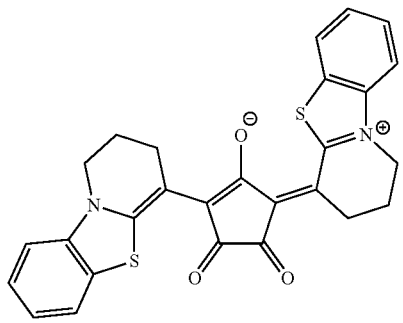

II-1

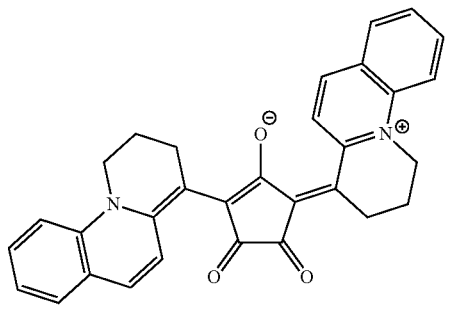

II-2

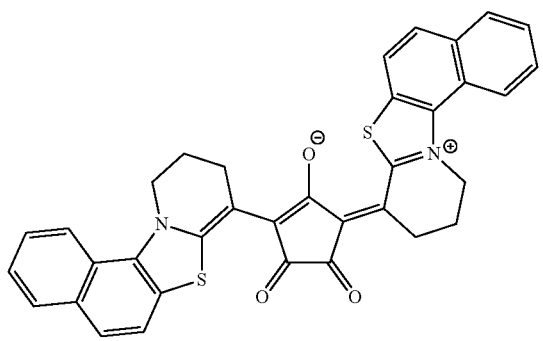

II-3

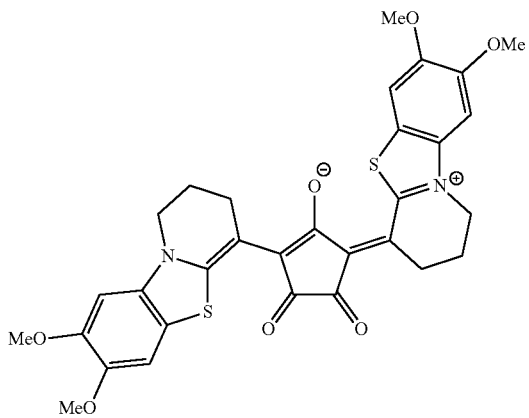

II-4

-continued

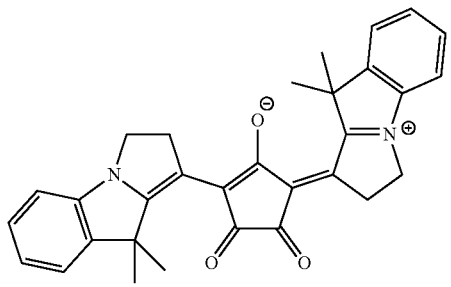
II-5

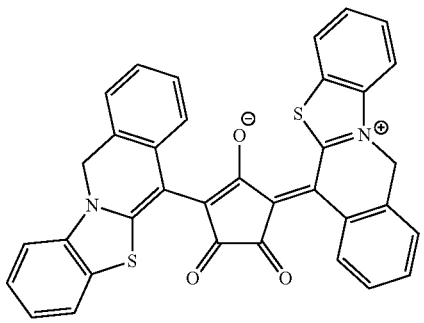
II-6

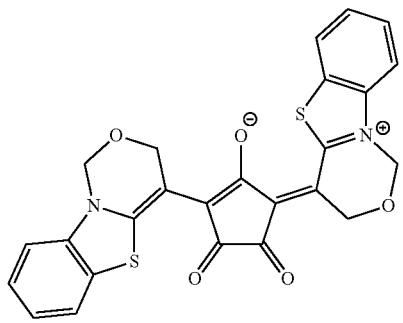
II-7

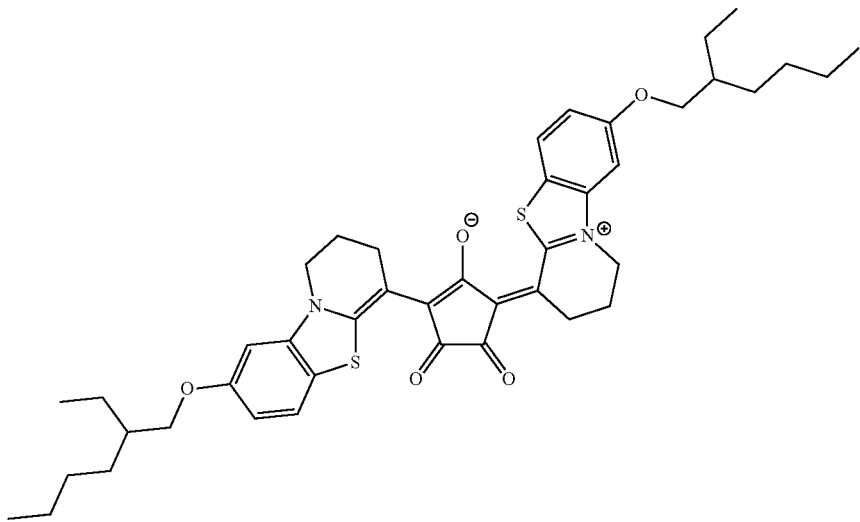
II-8

In the curable composition according to the embodiment of the present invention, the content of the compound A is preferably 0.1 to 70 mass % with respect to the total solid content of the curable composition according to the embodiment of the present invention. The lower limit is preferably 0.5 mass % or more and more preferably 1.0 mass % or more. The upper limit is preferably 60 mass % or less and more preferably 50 mass % or less. In a case where the curable composition according to the embodiment of the present invention includes two or more kinds of compounds A, it is preferable that the total content of the two or more kinds of compounds A is within the above-described range.

<<Other Near-Infrared Absorbers>>

The curable composition according to the embodiment of the present invention can contain a near-infrared absorber (other near-infrared absorbers) other than the above-described compound A. Examples of the other near-infrared absorbers include a pyrrolopyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a metal oxide, and a metal boride. Among these, a pyrrolopyrrole compound, a cyanine compound, a squarylium compound, a croconium compound, a phthalocyanine compound, a naphthalocyanine compound, or a iminium compound is more preferable and a pyrrolopyrrole compound, a cyanine compound, a squarylium compound, or a croconium compound is still more preferable. Examples of the pyrrolopyrrole compound include compounds described in paragraphs "0016" to "0058" of JP2009-263614A, compounds described in paragraphs "0037" to "0052" of JP2011-068731A, and compounds described in paragraphs "0010" to "0033" of WO2015/166873A. Examples of the squarylium compound include compounds described in paragraphs "0044" to "0049" of JP2011-208101A, compounds described in paragraphs "0060" and "0061" of JP6065169B, compounds described in paragraph "0040" of WO2016/181987A, compounds described in JP2015-176046A, compounds described in paragraph "0072" of WO2016/190162A, compounds described in paragraphs "0196" to "0228" of JP2016-074649A, compounds described in paragraph "0124" of JP2017-067963A, compounds described in WO2017/135359A, compounds described in JP2017-114956A, compounds described in JP6197940B, and compounds described in WO2016/120166A. Examples of the cyanine compound include compounds described in paragraphs "0044" and "0045" of JP2009-108267A, compounds described in paragraphs "0026" to "0030" of JP2002-194040A, compounds described in JP2015-172004A, compounds described in JP2015-172102A, compounds described in JP2008-088426A, and compounds described in paragraph "0090" of WO2016/190162A. Examples of the croconium compound include compounds described in JP2017-082029A. Examples of the iminium compound include compounds described in JP2008-528706A, compounds described in JP2012-012399A, compounds described in JP2007-092060A, and compounds described in paragraphs "0048" to "0063" of WO2018/043564A. Examples of the phthalocyanine compound include compounds described in paragraph "0093" of JP2012-077153A, oxytitanium phthalocyanine described in JP2006-343631A, and compounds described in paragraphs "0013" to "0029" of JP2013-195480A. Examples of the naphthalocyanine compound include compounds described in paragraph "0093" of JP2012-077153A. Examples of the metal oxide include indium tin oxide, antimony tin oxide, zinc oxide, Al-doped zinc oxide, fluorine-doped tin dioxide, niobium-doped titanium dioxide, and tungsten oxide. The details of tungsten oxide can be found in paragraph "0080" of JP2016-006476A, the content of which is incorporated herein by reference. Examples of the metal boride include lanthanum boride. Examples of a commercially available product of lanthanum boride include LaB$_6$—F (manufactured by JAPAN NEW METALS CO., LTD.). In addition, as the metal boride, compounds described in WO2017/119394A can also be used. Examples of a commercially available product of indium tin oxide include F-ITO (manufactured by DOWA HIGHTECH CO., LTD.).

In addition, as the near-infrared absorber, squarylium compounds described in JP2017-197437A, squarylium compounds described in paragraphs "0090" to "0107" of WO2017/213047A, pyrrole ring-containing compounds described in paragraphs "0019" to "0075" of JP2018-054760A, pyrrole ring-containing compounds described in paragraphs "0078" to "0082" of JP2018-040955A, pyrrole ring-containing compounds described in paragraphs "0043" to "0069" of JP2018-002773A, squarylium compounds having an aromatic ring at the amide α-position described in paragraphs "0024" to "0086" of JP2018-041047A, amide-linked squarylium compounds described in JP2017-179131A, compounds having a pyrrole bis-type squarylium skeleton or a croconium skeleton described in JP2017-141215A, dihydrocarbazole bis-type squarylium compounds described in JP2017-082029A, asymmetric compounds described in paragraphs "0027" to "0114" of JP2017-068120A, pyrrole ring containing compounds (carbazole type) described in JP2017-067963A, and phthalocyanine compounds described in JP6251530B.

In a case where the curable composition according to the embodiment of the present invention contains other near-infrared absorbers, the content of the other near-infrared absorbers is preferably 0.1 to 70 mass % with respect to the total solid content of the curable composition according to the embodiment of the present invention. The lower limit is preferably 0.5 mass % or more and more preferably 1.0 mass % or more. The upper limit is preferably 60 mass % or less and more preferably 50 mass % or less.

In addition, the total content of the other near-infrared absorbers and the compound A is preferably 0.1 to 70 mass % with respect to the total solid content of the curable composition according to the embodiment of the present invention. The lower limit is preferably 0.5 mass % or more and more preferably 1.0 mass % or more. The upper limit is preferably 60 mass % or less and more preferably 50 mass % or less. In a case where the curable composition according to the embodiment of the present invention includes two or more kinds of other near-infrared absorbers, it is preferable that the total content of the two or more kinds of near-infrared absorbers is within the above-described range.

In addition, the curable composition according to the embodiment of the present invention may be in an aspect in which the curable composition according to the embodiment of the present invention does not substantially contain the other near-infrared absorbers. The aspect in which the curable composition according to the embodiment of the present invention does not substantially contain the other near-infrared absorbers is preferably an aspect in which the content of the other near-infrared absorbers is 0.05 mass % or less with respect to the total solid content of the curable composition, more preferably an aspect in which the content of the other near-infrared absorbers is 0.01 mass % or less with respect to the total solid content of the curable composition, and still more preferably an aspect in which the other near-infrared absorbers are not contained.

<<Chromatic Colorant>>

The curable composition according to the embodiment of the present invention may contain a chromatic colorant. In the present invention, "chromatic colorant" denotes a colorant other than a white colorant and a black colorant. Examples of the chromatic colorant include yellow colorants, orange colorants, red colorants, green colorants, violet colorants, and blue colorants. The chromatic colorant may be a pigment or a dye, and is preferably a pigment. The pigment is preferably an organic pigment, and examples thereof include the following. However, the present invention is not limited to these examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and 231 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, 59, 62, and 63 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

In addition, as the green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used. Specific examples thereof include compounds described in WO2015/118720A. In addition, as the green pigment, compounds described in CN2010-6909027A, a phthalocyanine compound having a phosphoric acid ester as a ligand, or the like can also be used.

In addition, as the blue pigment, an aluminum phthalocyanine compound having a phosphorus atom can also be used. Examples of such a compound include an aluminum phthalocyanine compound in which the ligand is a phosphoric acid ester. Specific examples of the aluminum phthalocyanine compound having a phosphorus atom include compounds described in paragraphs "0022" to "0030" of JP2012-247591A and paragraph "0047" of JP2011-157478A.

In addition, as the yellow pigment, pigments described in JP2017-201003A and pigments described in JP2017-197719A can be used. In addition, as the yellow pigment, a metal azo pigment which includes at least one kind of an anion selected from an azo compound represented by Formula (I) or an azo compound having a tautomeric structure of the azo compound represented by Formula (I), two or more kinds of metal ions, and a melamine compound can also be used.

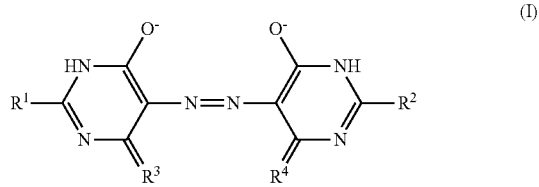

In the formula, $R^1$ and $R^2$ each independently represent —OH or —$NR^5R^6$, and $R^3$ and $R^4$ each independently represent =O or =$NR^7$, in which $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic, and is preferably linear or branched and more preferably linear. The alkyl group may have a substituent. The substituent is preferably a halogen atom, a hydroxy group, an alkoxy group, a cyano group, or an amino group.

With regard to the metal azo pigment, reference can be made to the description in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

As the red pigment, diketopyrrolopyrrole-based pigments described in JP2017-201384A, in which the structure has at least one substituted bromine atom, diketopyrrolopyrrole-based pigments described in paragraphs "0016" to "0022" of JP6248838B, and the like can also be used.

As the dye, a known dye can be used without any particular limitation. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, thiazole compounds described in JP2012-158649A, azo compounds described in JP2011-184493A, or azo compounds described in JP2011-145540A can also be used. In addition, as yellow dyes, quinophthalone compounds described in paragraphs "0011" to "0034" of JP2013-054339A, quinophthalone compounds described in paragraphs "0013" to "0058" of JP2014-026228A, or the like can also be used.

In a case where the curable composition according to the embodiment of the present invention contains a chromatic colorant, the content of the chromatic colorant is preferably 0.1 to 70 mass % with respect to the total solid content of the curable composition according to the embodiment of the present invention. The lower limit is preferably 0.5 mass % or more and more preferably 1.0 mass % or more. The upper limit is preferably 60 mass % or less and more preferably 50 mass % or less.

The content of the chromatic colorant is preferably 10 to 1000 parts by mass and more preferably 50 to 800 parts by mass with respect to 100 parts by mass of the compound A.

In addition, the total content of the chromatic colorant, the compound A, and the above-described other near-infrared absorbers is preferably 1 to 80 mass % with respect to the total solid content of the curable composition according to the embodiment of the present invention. The lower limit is preferably 5 mass % or more and more preferably 10 mass % or more. The upper limit is preferably 70 mass % or less and more preferably 60 mass % or less. In a case where the curable composition according to the embodiment of the present invention includes two or more kinds of chromatic colorants, it is preferable that the total content of the two or more kinds of chromatic colorants is within the above-described range.

In addition, it is also preferable that the curable composition according to the embodiment of the present invention does not substantially contain the chromatic colorant. A case where the curable composition according to the embodiment of the present invention does not substantially contain the chromatic colorant represents that the content of the chromatic colorant is preferably 0.05 mass % or less, more preferably 0.01 mass % or less, and still more preferably 0 mass % with respect to the total solid content of the curable composition.

<<Coloring Material which Allows Transmission of Infrared Light and Shields Visible Light>>

The curable composition according to the embodiment of the present invention can also contain a coloring material which allows transmission of infrared light and shields visible light (hereinafter, also referred to as a "coloring material which shields visible light").

In the present invention, it is preferable that the coloring material which shields visible light is a coloring material which absorbs light in a wavelength range of violet to red. In addition, in the present invention, it is preferable that the coloring material which shields visible light is a coloring material which shields light in a wavelength range of 450 to 650 nm. In addition, it is preferable that the coloring material which shields visible light is a coloring material which allows transmission of light in a wavelength range of 900 to 1300 nm.

In the present invention, it is preferable that the coloring material which shields visible light satisfies at least one of the following requirement (A) or (B).
(A): coloring material which shields visible light includes two or more chromatic colorants, and a combination of the two or more chromatic colorants forms black.
(B): coloring material which shields visible light includes an organic black colorant.

Examples of the chromatic colorant include the above-described chromatic colorants. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, JP2015-525260A, and the like, and the bisbenzofuranone compound is available, for example, as "Irgaphor Black" manufactured by BASF. Examples of the perylene compound include compounds described in paragraphs "0016" to "0020" of JP2017-226821A, C.I. Pigment Black 31 and 32, and Lumogen Black FK4280. Examples of the azomethine compound include compounds described in JP1989-170601A (JP-H01-170601A) and JP1990-034664A (JP-H02-034664A). For example, "CHROMOFINE BLACK A1103" (manufactured by Dainichiseika Color & Chemicals Mfg. Co., Ltd.) is available.

In a case where a combination of two or more chromatic colorants forms black, examples of the combination of the chromatic colorants include the following.

(1) aspect in which the coloring material which shields visible light contains a yellow colorant, a blue colorant, a violet colorant, and a red colorant (2) aspect in which the coloring material which shields visible light contains a yellow colorant, a blue colorant, and a red colorant (3) aspect in which the coloring material which shields visible light contains a yellow colorant, a violet colorant, and a red colorant (4) aspect in which the coloring material which shields visible light contains a yellow colorant and a violet colorant (5) aspect in which the coloring material which shields visible light contains a green colorant, a blue colorant, a violet colorant, and a red colorant (6) aspect in which the coloring material which shields visible light contains a violet colorant and an orange colorant (7) aspect in which the coloring material which shields visible light contains a green colorant, a violet colorant, and a red colorant (8) aspect in which the coloring material which shields visible light contains a green colorant and a red colorant In a case where the curable composition according to the embodiment of the present invention contains a coloring material which shields visible light, the content of the coloring material which shields visible light is preferably 60 mass % or less, more preferably 50 mass % or less, still more preferably 30 mass % or less, even more preferably 20 mass % or less, and particularly preferably 15 mass % or less with respect to the total solid content of the curable composition. The lower limit may be, for example, 0.1 mass % or more or 0.5 mass % or more.

In addition, it is also preferable that the curable composition according to the embodiment of the present invention does not substantially contain the coloring material which shields visible light. A case where the curable composition according to the embodiment of the present invention does not substantially contain coloring material which shields visible light represents that the content of the coloring material which shields visible light is preferably 0.05 mass % or less, more preferably 0.01 mass % or less, and still more preferably 0 mass % with respect to the total solid content of the curable composition.

<<Pigment Derivative>>

In a case where the curable composition according to the embodiment of the present invention includes the pigment, it is preferable that the curable composition according to the embodiment of the present invention further contains a pigment derivative. Examples of the pigment derivative include a compound having a structure in which a part of the pigment is substituted with an acidic group or a basic group. From the viewpoint of dispersibility and dispersion stability, the pigment derivative preferably contains a pigment derivative having an acidic group or a basic group. In a case where the curable composition according to the embodiment of the present invention contains a pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is within the above-described range, dispersibility of the pigment can be enhanced, and aggregation of the pigment can be efficiently suppressed. As the pigment derivative, one kind may be used alone, or two or more kinds may be used in combination. In a case where two or more kinds of pigment derivatives are used in combination, it is preferable that the total content of the two or more kinds of pigment derivatives is within the above-described range.

<<Curable Compound>>

The curable composition according to the embodiment of the present invention contains a curable compound. Examples of the curable compound include a crosslinkable compound and a resin. The resin may be a non-crosslinkable resin (resin not having a crosslinkable group), or may be a crosslinkable resin (resin having a crosslinkable group). Examples of the crosslinkable group include an ethylenically unsaturated bonding group, a cyclic ether group, a methylol group, an alkoxymethyl group, an alkoxysilyl group, and a chlorosilyl group. Among these, an ethylenically unsaturated bonding group or a cyclic ether group is preferable and an ethylenically unsaturated bonding group is more preferable. Examples of the ethylenically unsaturated bonding group include a vinyl group, a (meth)allyl group, and a (meth)acryloyl group. Examples of the cyclic ether group include an epoxy group and an oxetanyl group, and an epoxy group is preferable. Examples of the alkoxysilyl group include a monoalkoxysilyl group, a dialkoxysilyl group, and a trialkoxysilyl group, and a dialkoxysilyl group or a trialkoxysilyl group is preferable. In addition, the number of carbon atoms in an alkoxy group of the alkoxysilyl group is preferably 1 to 5, more preferably 1 to 3, and particularly preferably 1 or 2. Examples of the chlorosilyl group include a monochlorosilyl group, a dichlorosilyl group, and a trichlorosilyl group, and a dichlorosilyl group or a trichlorosilyl group is preferable and a trichlorosilyl group is more preferable.

In the present invention, as the curable compound, it is preferable that a compound including at least a resin is used, it is more preferable that a resin and a monomer-type crosslinkable compound are used, and it is still more preferable that a resin and a monomer-type crosslinkable compound including an ethylenically unsaturated bonding group are used.

The content of the curable compound is preferably 0.1 to 80 mass % with respect to the total solid content of the curable composition. The lower limit is preferably 0.5 mass % or more and more preferably 1 mass % or more. The upper limit is preferably 70 mass % or less, more preferably 60 mass % or less, still more preferably 50 mass % or less, and particularly preferably 40 mass % or less. The curable composition according to the embodiment of the present invention may include one curable compound or two or more kinds of curable compounds. In a case where the curable composition includes two or more kinds of curable compounds, it is preferable that the total content of the curable compounds is within the above-described range.

(Crosslinkable Compound)

Examples of the crosslinkable compound include a compound including an ethylenically unsaturated bonding group, a compound having a cyclic ether group, a compound having a methylol group, a compound having an alkoxymethyl group, a compound having an alkoxysilyl group, and a compound having a chlorosilyl group. The crosslinkable compound may be a monomer or a resin. The compound including an ethylenically unsaturated bonding group (preferably a monomer-type crosslinkable compound including an ethylenically unsaturated bonding group) can be preferably used as a radically polymerizable compound. In addition, the compound having a cyclic ether group, the compound having a methylol group, and the compound having an alkoxymethyl group can be preferably used as a cationically polymerizable compound.

The molecular weight of the monomer-type crosslinkable compound (crosslinkable monomer) is preferably less than 2000, more preferably 100 or more and less than 2000, and still more preferably 200 or more and less than 2000. The upper limit is, for example, preferably 1500 or less. The weight-average molecular weight (Mw) of the resin-type (polymer-type) crosslinkable compound is preferably 2000 to 2000000. The upper limit is preferably 1000000 or less and more preferably 500000 or less. The lower limit is preferably 3000 or more and more preferably 5000 or more.

Examples of the resin-type crosslinkable compound include an epoxy resin, and a resin including a repeating unit having a crosslinkable group. Examples of the repeating unit having a crosslinkable group include the following (A2-1) to (A2-4).

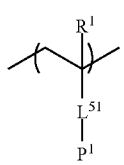

(A2-1)

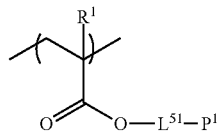

(A2-2)

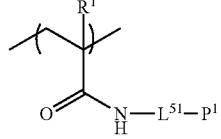

(A2-3)

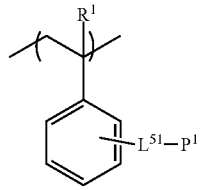

(A2-4)

$R^1$ represents a hydrogen atom or an alkyl group. The number of carbon atoms in the alkyl group is preferably 1 to 5, still more preferably 1 to 3, and particularly preferably 1. $R^1$ is preferably a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR$^{10}$—(R$^{10}$ represents a hydrogen atom or an alkyl group and is preferably a hydrogen atom), and a group of a combination of these groups. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a crosslinkable group. Examples of the crosslinkable group include an ethylenically unsaturated bonding group, a cyclic ether group, a methylol group, an alkoxymethyl group, an alkoxysilyl group, and a chlorosilyl group.

The compound including an ethylenically unsaturated bonding group as a monomer-type crosslinkable compound is preferably a 3- to 15-functional (meth)acrylate compound and more preferably a 3- to 6-functional (meth)acrylate compound. Specific examples thereof include compounds described in paragraphs "0095" to "0108" of JP2009-288705A, paragraph "0227" of JP2013-029760A, paragraphs "0254" to "0257" of JP2008-292970A, paragraphs "0034" to "0038" of JP2013-253224A, paragraph "0477" of JP2012-208494A, JP2017-048367A, JP6057891B, and JP6031807B, the contents of which are incorporated herein by reference.

Examples of the compound including an ethylenically unsaturated bonding group include dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), and a compound having a structure in which the (meth)acryloyl group of these compounds is bonded through an ethylene glycol and/or a propylene glycol residue (for example, SR454 and SR499 which are commercially available from Sartomer). In addition, as the compound including an ethylenically unsaturated bonding group, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOEISHA CHEMICAL Co., Ltd.), and the like can also be used.

In addition, as the compound including an ethylenically unsaturated bonding group, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

The compound including an ethylenically unsaturated bonding group may further have an acid group such as a carboxyl group, a sulfo group, or a phosphoric acid group. Examples of a commercially available product of such a compound include ARONIX M-510, M-520, and ARONIX TO-2349 (manufactured by TOAGOSEI CO., LTD.).

The compound including an ethylenically unsaturated bonding group is also preferably a compound having a caprolactone structure. With regard to the compound having a caprolactone structure, reference can be made to the description in paragraphs "0042" to "0045" of JP2013-253224A, the content of which is incorporated herein by reference. As the compound having a caprolactone structure, for example, KAYARAD DPCA series (manufactured by Nippon Kayaku Co., Ltd.) are commercially available, and examples thereof include DPCA-20, DPCA-30, DPCA-60, and DPCA-120.

As the compound including an ethylenically unsaturated bonding group, a compound having an ethylenically unsaturated bonding group and an alkyleneoxy group can also be used. Such a compound is preferably a compound having an ethylenically unsaturated bonding group and an ethyleneoxy group and/or a propyleneoxy group, more preferably a compound having an ethylenically unsaturated bonding group and an ethyleneoxy group, and still more preferably a 3- to 6-functional (meth)acrylate compound having 4 to 20 ethyleneoxy groups. Examples of a commercially available product thereof include SR-494 manufactured by Sartomer, which is a tetrafunctional (meth)acrylate having four ethyleneoxy groups, and KAYARAD TPA-330 manufactured by Nippon Kayaku Co., Ltd., which is a trifunctional (meth) acrylate having three isobutyleneoxy groups.

As the compound including an ethylenically unsaturated bonding group, a polymerizable compound having a fluorene skeleton can also be used. Examples of a commercially available product thereof include OGSOL EA-0200 and EA-0300 (manufactured by Osaka Gas Chemicals Co., Ltd., (meth)acrylate monomer having a fluorene skeleton).

As the compound including an ethylenically unsaturated bonding group, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

In addition, as the compound including an ethylenically unsaturated bonding group, it is also preferable to use UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600, and LINC-202UA (manufactured by KYOEISHA CHEMICAL Co., Ltd.), 8UH-1006 and 8UH-1012 (all of which are manufactured by Taisei Fine Chemical Co., Ltd.), Light Acrylate POB-A0 (manufactured by KYOEISHA CHEMICAL Co., Ltd.), and the like.

In a case where the curable composition according to the embodiment of the present invention contains a compound including an ethylenically unsaturated bonding group, the content of the compound including an ethylenically unsaturated bonding group is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less.

In addition, the content of the monomer-type compound including an ethylenically unsaturated bonding group is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less.

Examples of the compound having a cyclic ether group include a compound having an epoxy group and a compound having an oxetanyl group, and a compound having an epoxy group is preferable. Examples of the compound having an epoxy group include a compound having 1 to 100 epoxy groups in one molecule. The upper limit of the number of epoxy groups may be, for example, 10 or less or 5 or less. The lower limit of the number of epoxy groups is preferably 2 or more. As the compound having an epoxy group, compounds described in paragraphs "0034" to "0036" of JP2013-011869A, paragraphs "0147" to "0156" of JP2014-043556A, and paragraphs "0085" to "0092" of JP2014-089408A, and compounds described in JP2017-179172A can also be used. The contents of which are incorporated herein by reference.

The compound having an epoxy group may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the compound having an epoxy group is preferably 200 to 100000 and more preferably 500 to 50000. The upper limit of the weight-average molecular weight is preferably 10000 or less, more preferably 5000 or less, and still more preferably 3000 or less.

Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation., an epoxy group-containing polymer).

In a case where the curable composition according to the embodiment of the present invention contains a compound having a cyclic ether group, the content of the compound having a cyclic ether group is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less.

Examples of the compound having a methylol group (hereinafter, also referred to as a methylol compound) include a compound in which a methylol group is bonded to a nitrogen atom or a carbon atom which forms an aromatic ring. In addition, examples of the compound having an alkoxymethyl group (hereinafter, also referred to as an alkoxymethyl compound) include a compound in which an alkoxymethyl group is bonded to a nitrogen atom or a carbon atom which forms an aromatic ring. As the compound in which an alkoxymethyl group or a methylol group is bonded to a nitrogen atom, for example, alkoxy methylated melamine, methylolated melamine, alkoxy methylated benzoguanamine, methylolated benzoguanamine, alkoxy methylated glycoluril, methylolated glycoluril, alkoxy methylated urea, or methylolated urea is preferable. In addition, compounds described in paragraphs "0134" to "0147" of JP2004-295116A and paragraphs "0095" to "0126" of JP2014-089408A can also be used. In a case where the curable composition according to the embodiment of the present invention includes a methylol compound, the content of the methylol compound is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less. In addition, in a case where the curable composition according to the embodiment of the present invention includes an alkoxymethyl compound, the content of the alkoxymethyl compound is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less.

Examples of the compound having an alkoxysilyl group and the compound having a chlorosilyl group include compounds described in paragraphs "0123" to "0125" of WO2017/104283A. In a case where the curable composition according to the embodiment of the present invention includes a compound having an alkoxysilyl group, the content of the compound having an alkoxysilyl group is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less. In addition, in a case where the curable composition according to the embodiment of the present invention includes a compound having a chlorosilyl group, the content of the compound having a chlorosilyl group is preferably 0.1 to 50 mass % with respect to the total solid content of the curable composition. The lower limit is, for example, more preferably 0.5 mass % or more, and still more preferably 1 mass % or more. The upper limit is, for example, more preferably 40 mass % or less and still more preferably 30 mass % or less.

(Resin)

A resin can be used as the curable compound in the curable composition according to the embodiment of the present invention. It is preferable that the curable compound includes at least a resin. The resin can also be used as a dispersant. The resin which is used to disperse the pigment and the like will also be called a dispersant. However, the above-described uses of the resin are merely exemplary, and the resin can be used for purposes other than the uses. A resin having a crosslinkable group also corresponds to the crosslinkable compound.

Examples of the resin include a compound having a repeating unit. Specific examples of the resin include a (meth)acrylic resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, a siloxane resin, and a urethane resin. Among these resins, one kind may be used alone, or a mixture of two or more kinds may be used. From the viewpoint of improving heat resistance, as the cyclic olefin resin, a norbornene resin can be preferably used. Examples of a commercially available product of the norbornene resin include ARTON series (for example, ARTON F4520) manufactured by JSR Corporation. Examples of a commercially available product of the polyimide resin include Neoprim (registered trademark) series (for example, C3450) manufactured by MITSUBISHI GAS CHEMICAL COMPANY, INC. Examples of the epoxy resin include an epoxy resin which is a glycidyl etherified product of a phenol compound, an epoxy resin which is a glycidyl etherified product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. In addition, as the epoxy resin, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. Examples of the urethane resin include 8UH-1006 and 8UH-1012 (manufactured by Taisei Fine Chemical Co., Ltd.). In addition, as the resin, resins described in Examples of WO2016/088645A, resins described in JP2017-057265A, resins described in JP2017-032685A, resins described in JP2017-075248A, resins described in JP2017-066240A, resins described in JP2017-167513A, resins described in paragraphs "0041" to "0060" of JP2017-206689A, and resins described in paragraphs "0022" to "007" of JP2018-

010856A can also be used. In addition, as the resin, a resin having a fluorene skeleton can also be preferably used. Examples of the resin having a fluorene skeleton include a resin having the following structure. In the following structural formula, A represents a residue of a carboxylic acid dianhydride selected from pyromellitic acid dianhydride, benzophenone tetracarboxylic acid dianhydride, biphenyl tetracarboxylic acid dianhydride, or diphenyl ether tetracarboxylic acid dianhydride, and M represents a phenyl group or a benzyl group. With regard to the resin having a fluorene skeleton, reference can be made to the description in US2017/0102610A, the content of which is incorporated herein by reference.

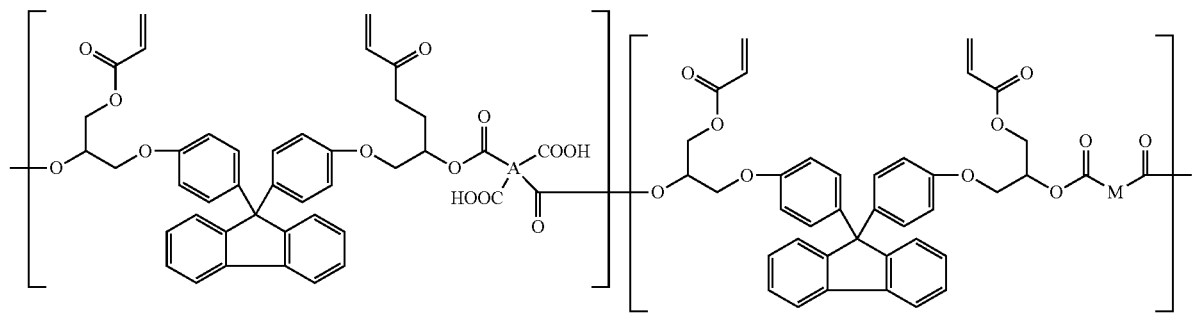

The weight-average molecular weight (Mw) of the resin is preferably 2000 to 2000000. The upper limit is preferably 1000000 or less and more preferably 500000 or less. The lower limit is preferably 3000 or more and more preferably 5000 or more.

The resin used in the present invention may have an acid group. Examples of the acid group include a carboxyl group, a phosphate group, a sulfo group, and a phenolic hydroxy group, and a carboxyl group is preferable. Among these acid groups, one kind may be used alone, or two or more kinds may be used in combination. The resin having an acid group can also be used as an alkali-soluble resin. As the resin having an acid group, a resin including a repeating unit having a carboxyl group in the side chain is preferable.

The resin having an acid group may further contain a repeating unit having a crosslinkable group. In a case where the resin having an acid group further contains a repeating unit having a crosslinkable group, the content of the repeating unit having a crosslinkable group is preferably 10 to 90 mol %, more preferably 20 to 90 mol %, and still more preferably 20 to 85 mol % with respect to all the repeating units. In addition, the content of the repeating unit having an acid group is preferably 1 to 50 mol %, more preferably 5 to 40 mol %, and still more preferably 5 to 30 mol % with respect to all the repeating units.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

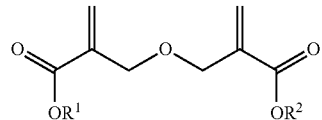 (ED1)

In Formula (ED1), $R^1$ and $R^2$ each independently represent a hydrogen atom or a hydrocarbon group having 1 to 25 carbon atoms which may have a substituent.

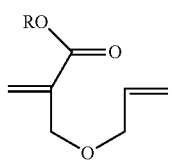 (ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

It is also preferable that the resin having an acid group includes a repeating unit derived from a compound represented by Formula (X).

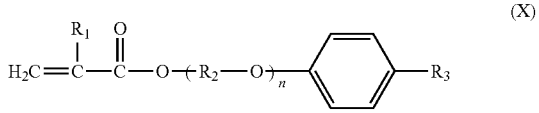 (X)

In Formula (X), $R_1$ represents a hydrogen atom or a methyl group, $R_2$ represents an alkylene group having 2 to 10 carbon atoms, and R3 represents a hydrogen atom or an alkyl group having 1 to 20 carbon atoms which may have a benzene ring. n represents an integer of 1 to 15.

With regard to the resin having an acid group, reference can be made to the description in paragraphs "0558" to "0571" of JP2012-208494A (paragraphs "0685" to "0700" of the corresponding US2012/0235099A) and the description in paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or more and more preferably 70 mgKOH/g or more. The upper limit is preferably 150 mgKOH/g or less and more preferably 120 mgKOH/g or less.

Examples of the resin having an acid group include resins having the following structures. In the following structural formulae, Me represents a methyl group.

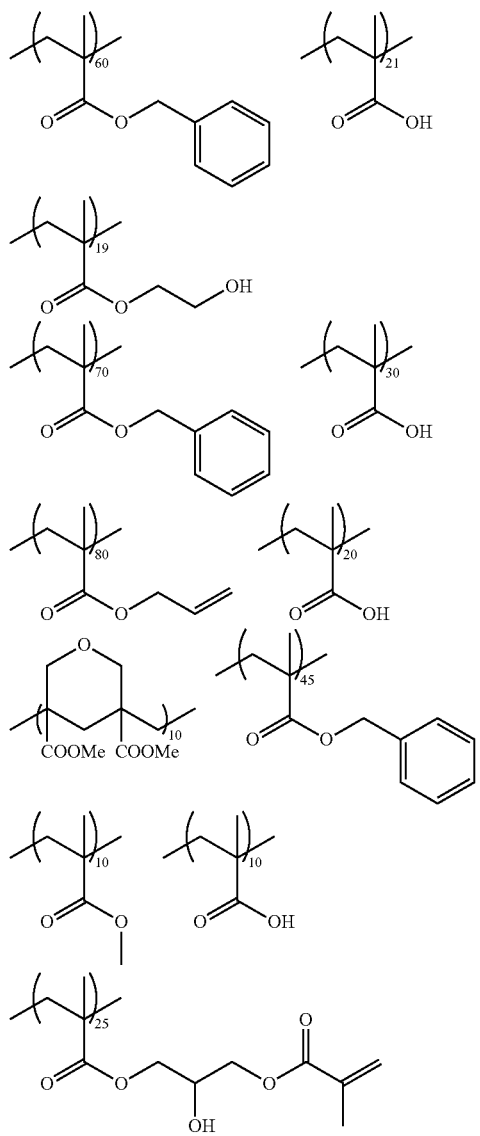

The curable composition according to the embodiment of the present invention may include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total content of the acid group and the basic group is 100 mol %, and more preferably a resin substantially consisting of only an acid group. The acid group in the acidic dispersant (acidic resin) is preferably a carboxyl group. The acid value of the acidic dispersant (acidic resin) is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total content of the acid group and the basic group is 100 mol %. The basic group in the basic dispersant is preferably an amino group.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraphs "0102" to "0166" of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraphs "0196" to "0209" of JP2013-043962A.

In addition, it is also preferable that the resin used as a dispersant is a resin including a repeating unit having an ethylenically unsaturated bonding group in the side chain. The content of the repeating unit having an ethylenically unsaturated bonding group in the side chain is preferably 10 mol % or more, more preferably 10 to 80 mol %, and still more preferably 20 to 70 mol % with respect to all the repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. In addition, pigment dispersants described in paragraphs "0041" to "0130" of JP2014-130338A can also be used, the contents of which are incorporated herein by reference. In addition, the above-described resin (alkali-soluble resin) having an acid group, and the like can also be used as a dispersant.

In a case where the curable composition according to the embodiment of the present invention contains a resin, the content of the resin is preferably 1 to 80 mass % with respect to the total solid content of the curable composition. The lower limit is preferably 5 mass % or more, more preferably 10 mass % or more, still more preferably 15 mass % or more, and particularly preferably 20 mass % or more. The upper limit is preferably 70 mass % or less, more preferably 60 mass % or less, still more preferably 50 mass % or less, and particularly preferably 40 mass % or less. In addition, the content of the resin containing an acid group is preferably 0.1 to 50 mass % with respect to the total solid content of the curable composition. The lower limit is preferably 0.5 mass % or more, more preferably 1 mass % or more, still more preferably 2 mass % or more, and particularly preferably 3 mass % or more. The upper limit is more preferably 30 mass % or less and still more preferably 20 mass % or less. In addition, in a case where the curable composition according to the embodiment of the present invention contains a dispersant as the resin, the content of the dispersant is preferably 0.1 to 40 mass % with respect to the total solid content of the curable composition. The upper limit is preferably 20 mass % or less and still more preferably 10 mass % or less. The lower limit is preferably 0.5 mass % or more and still more preferably 1 mass % or more. In addition, the content of the dispersant is preferably 1 to 100 parts by mass with respect to 100 parts by mass of the pigment. The upper limit is preferably 80 parts by mass or less and more preferably 75 parts by mass or less. The lower limit is preferably 2.5 parts by mass or more and more preferably 5 parts by mass or more.

The curable composition according to the embodiment of the present invention may include one resin or two or more kinds of resins. In a case where the curable composition includes two or more kinds of resins, it is preferable that the total content of the resins is within the above-described range.

<<Photopolymerization Initiator>>

The curable composition according to the embodiment of the present invention can contain a photopolymerization initiator. In a case where the curable composition according to the embodiment of the present invention contains a radically polymerizable compound as a curable compound, it is preferable that the curable composition according to the embodiment of the present invention further contains a photopolymerization initiator. The photopolymerization initiator can be appropriately selected from known photopolymerization initiators. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, and an acylphosphine compound is more preferable, and an oxime compound is still more preferable. With regard to the photopolymerization initiator, reference can be made to the description in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF). Examples of a commercially available product of the α-aminoketone compound include IRGACURE-907, IRGACURE-369, IRGACURE-379, and IRGACURE-379EG (all of which are manufactured by BASF). Examples of a commercially available product of the acylphosphine compound include IRGACURE-819, and DAROCUR-TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraphs "0025" to "0038" of WO2017/164127A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product thereof include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no coloring property or a compound having high transparency and being resistant to discoloration. Examples of a commercially available product thereof include ADEKA ARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include compounds described in JP2014-137466A. The content thereof is incorporated herein by reference.

In the present invention, an oxime compound having a fluorine atom can also be used as the photopolymerization initiator. Specific examples of the oxime compound having a fluorine atom include compounds described in JP2010-262028A, Compounds 24 and 36 to 40 described in JP2014-

500852A, and Compound (C-3) described in JP2013-164471A. The content thereof is incorporated herein by reference.

In the present invention, an oxime compound having a nitro group can be used as the photopolymerization initiator. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to 0025" of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

(C-1)

(C-2)

(C-3)

(C-4)

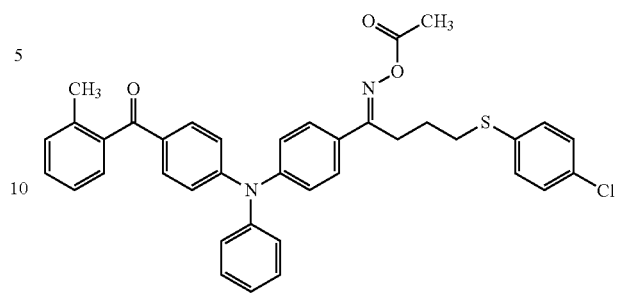

(C-5)

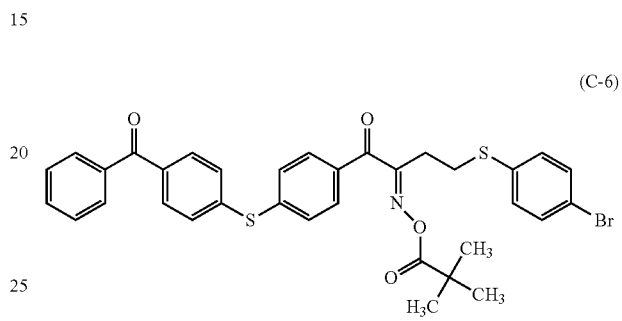

(C-6)

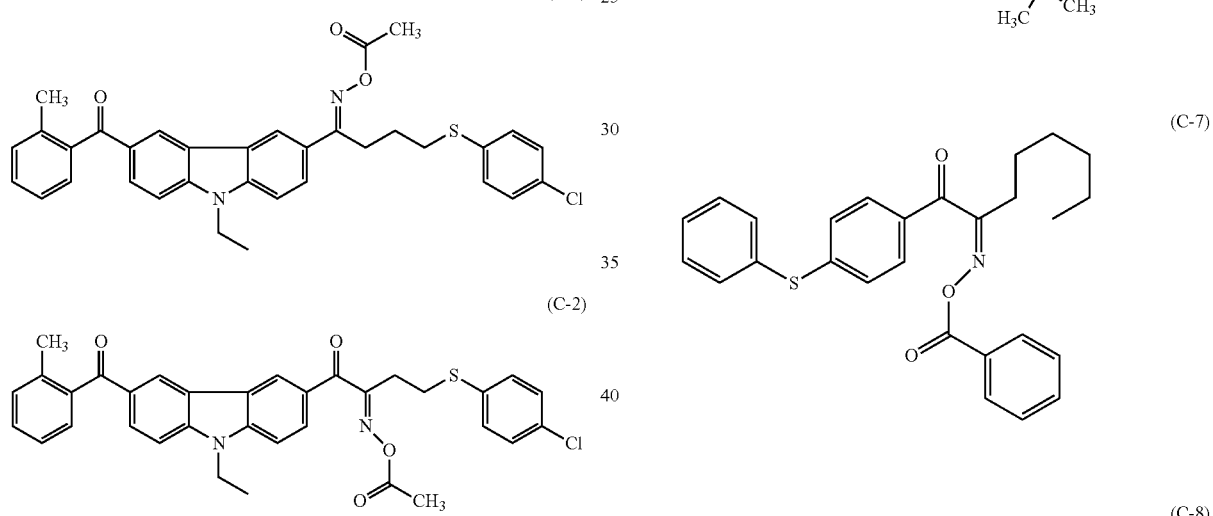

(C-7)

(C-8)

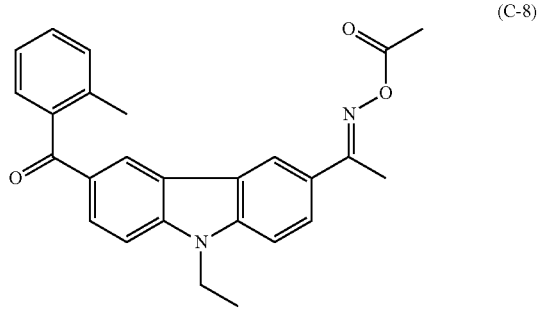

(C-9)

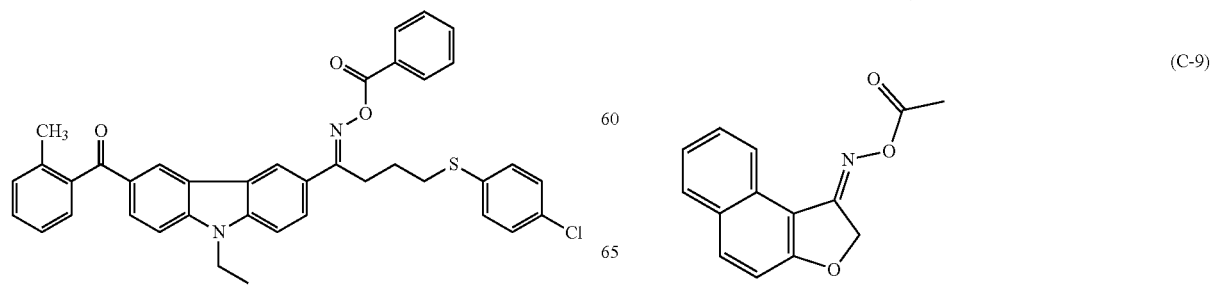

-continued

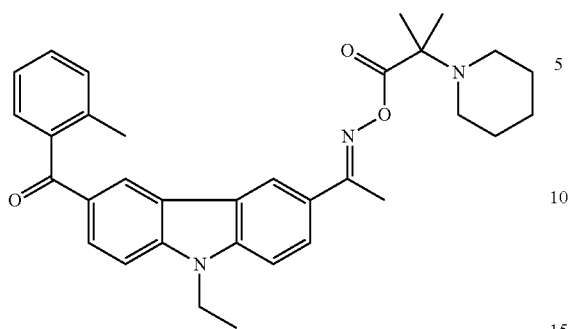
(C-10)

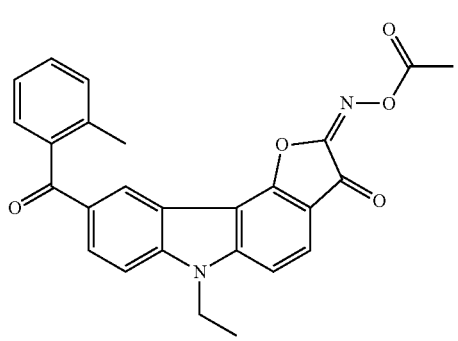
(C-11)

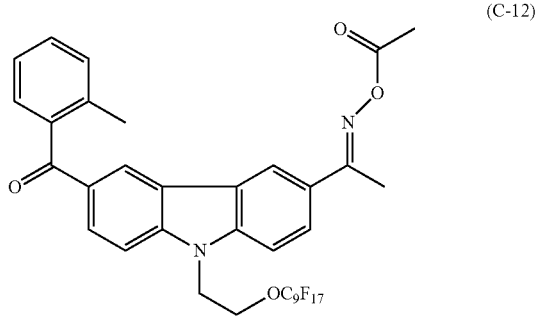
(C-12)

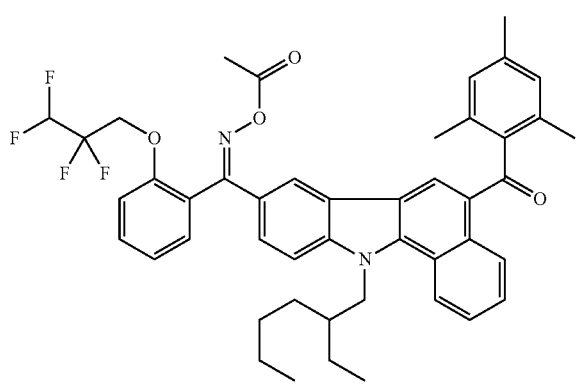
(C-13)

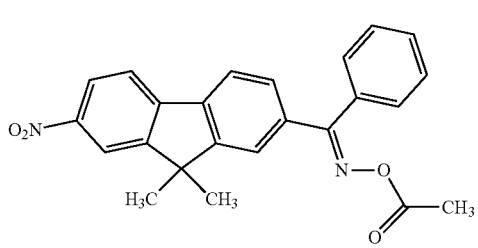
(C-14)

-continued

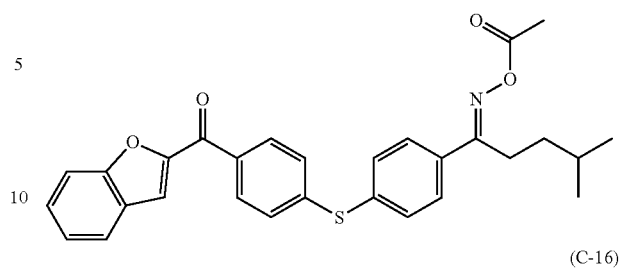
(C-15)

(C-16)

The oxime compound is preferably a compound having a maximum absorption wavelength in a wavelength range of 350 to 500 nm and more preferably a compound having a maximum absorption wavelength in a wavelength range of 360 to 480 nm. In addition, from the viewpoint of sensitivity, the molar absorption coefficient of the oxime compound at a wavelength of 365 nm or at a wavelength of 405 nm is preferably high, more preferably 1,000 to 300,000, still more preferably 2,000 to 300,000, and particularly preferably 5,000 to 200,000. The molar absorption coefficient of a compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photopolymerization initiator, a bifunctional or tri- or more functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the composition can be improved. Specific examples of the bifunctional or tri- or more functional photoradical polymerization initiator include dimers of the oxime compounds described in JP2010-527339A, JP2011-524436A, WO2015/004565A, paragraphs "0407" to "0412" of JP2016-532675A, and paragraphs "0039" to "0055" of WO2017/033680A; the compound (E) and compound (G) described in JP2013-522445A; Cmpd 1 to 7 described in WO2016/034963A; the oxime ester photoinitiators described in paragraph "0007" of JP2017-523465A; the photoinitiators described in paragraphs "0020" to "0033" of JP2017-167399A; and the photopolymerization initiator (A) described in paragraphs "0017" to "0026" of JP2017-151342A.

It is also preferable that the photopolymerization initiator includes an oxime compound and an α-aminoketone compound. By using the oxime compound and the α-aminoketone compound in combination, developability is improved, and a pattern having excellent rectangularity is likely to be formed. In a case where an oxime compound and an α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the curable composition. In a case where the content of the photopolymerization initiator is within the above-described range, better sensitivity and pattern formability can be obtained. The curable composition according to the embodiment of the present invention may include one photopolymerization initiator or two or more kinds of photopolymerization initiators. In a case where the curable composition includes two or more kinds of photopolymerization initiators, it is preferable that the total content of the photopolymerization initiators is within the above-described range.

<<Acid Generator>>

The curable composition according to the embodiment of the present invention can contain an acid generator. In particular, in a case where the curable compound of the present invention contains a cationically polymerizable compound such as a compound having a cyclic ether group, it is preferable to contain an acid generator. The acid generator is preferably a compound (photoacid generator) generating an acid upon irradiation with light. Examples of the acid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. Examples of the type of acid generator, specific compounds, and preferred examples include compounds described in paragraphs "0066" to "0122" of JP2008-013646A, and these are also applicable to the present invention. In addition, examples of preferred compounds as the acid generator which can be used in the present invention include compounds represented by Formulae (b1), (b2), and (b3).

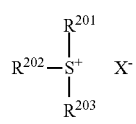

(b1)

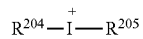

(b2)

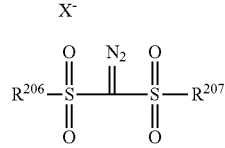

(b3)

In Formula (b1), $R^{201}$, $R^{202}$, and $R^{203}$ each independently represent an organic group. $X^-$ represents a non-nucleophilic anion, and a sulfonate anion, a carboxylate anion, a bis(alkylsulfonyl)amide anion, a tris(alkylsulfonyl)methide anion, $BF_4^-$, $PF_6^-$, or $SbF_6^-$ is preferable and $BF_4^-$, $PF_6^-$, or $SbF_6^-$ is more preferable.

Examples of a commercially available product of the acid generator include WPAG-469 (manufactured by Wako Pure Chemical Industries, Ltd.) and CPI-100P (manufactured by San-Apro Ltd.).

The content of the acid generator is preferably 0.1 to 50 mass %, more preferably 0.5 to 30 mass %, and still more preferably 0.5 to 20 mass % with respect to the total solid content of the curable composition. The curable composition according to the embodiment of the present invention may include one acid generator or two or more kinds of acid generators. In a case where the curable composition includes two or more kinds of acid generators, it is preferable that the total content of the acid generators is within the above-described range.

<<Crosslinking Aid>>

The curable composition according to the embodiment of the present invention preferably includes a crosslinking aid for the purpose of promoting the reaction of the crosslinkable compound. Examples of the crosslinking aid include at least one selected from polyfunctional thiols, alcohols, amines, and carboxylic acids.

Examples of the polyfunctional thiol as a crosslinking aid include a compound having two or more thiol groups in the molecule. As the polyfunctional thiol, secondary alkanethiols are preferable, and a compound having a structure represented by Formula (T1) is particularly preferable.

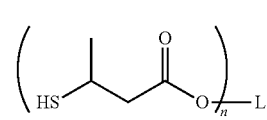

Formula (T1)

(in Formula (T1), n represents an integer of 2 to 4, and L represents a divalent to tetravalent linking group)

In Formula (T1), the linking group L is preferably an aliphatic group having 2 to 12 carbon atoms, and it is particularly preferable that n is 2 and L is an alkylene group having 2 to 12 carbon atoms. Specific examples of the polyfunctional thiol include compounds represented by Structural Formulae (T2) to (T4), and a compound represented by Formula (T2) is particularly preferable. The polyfunctional thiol can be used alone or in combination of two or more thereof.

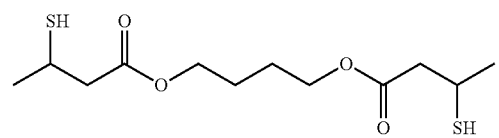

(T2)

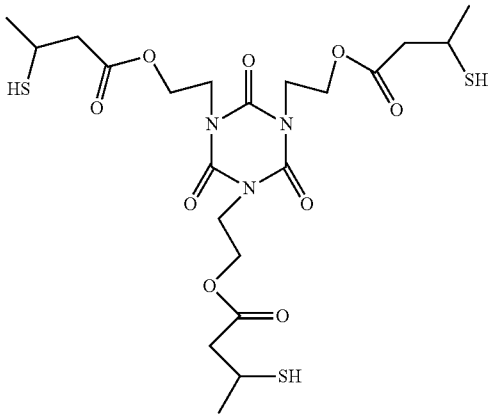

(T3)

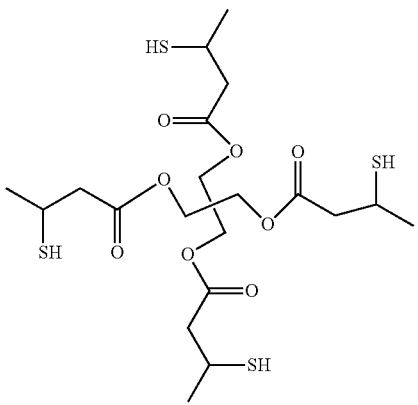

(T4)

As the amine as a crosslinking aid, a polyvalent amine is preferable and a diamine is more preferable. Examples thereof include hexamethylenediamine, triethylenetetramine, and polyethyleneimine.

As the alcohol as a crosslinking aid, a polyhydric alcohol is preferable and a diol is more preferable. Examples thereof include a polyether diol compound, a polyester diol compound, and a polycarbonate diol compound. With regard to specific examples of the alcohol, for example, reference can be made to the description in paragraphs "0128" to "0163", and "0172" of JP2013-253224A, the content of which is incorporated herein by reference.

Examples of the carboxylic acid as a crosslinking aid include 3,3',4,4'-biphenyltetracarboxylic acid (anhydride), maleic acid, phthalic acid, and trimellitic acid. In addition, a carboxy group-containing epoxy curing agent described in JP2017-036379A can also be used.

In addition, as the crosslinking aid, compounds described in paragraphs "0085" to "0092" of JP5765059B can also be used.

The content of the crosslinking aid is preferably 1 to 1000 parts by mass, more preferably 1 to 500 parts by mass, and still more preferably 1 to 200 parts by mass with respect to 100 parts by mass of the crosslinkable compound. The curable composition according to the embodiment of the present invention may include one crosslinking aid or two or more kinds of crosslinking aids. In a case where the curable composition includes two or more kinds of crosslinking aids, it is preferable that the total content of the crosslinking aids is within the above-described range.

<<Catalyst>>

The curable composition according to the embodiment of the present invention can further contain a catalyst. In particular, in a case of using, as the curable compound, a compound having an alkoxysilyl group or a chlorosilyl group, it is preferable to contain a catalyst. According to this aspect, the sol-gel reaction is promoted, and a firmer film is easily obtained. Examples of the catalyst include acid catalysts and base catalysts. Examples of the acid catalyst include hydrochloric acid, nitric acid, sulfuric acid, sulfurous acid, hydrogen sulfide, perchloric acid, hydrogen peroxide, carbonic acid, carboxylic acid such as formic acid and acetic acid, substituted carboxylic acid in which R in the structural formula represented by RCOOH is replaced with another element or a substituent, sulfonic acid such as benzenesulfonic acid, and phosphoric acid. In addition, Lewis acids such as aluminum chloride, aluminum acetylacetonate, zinc chloride, tin chloride, boron trifluoride diethyl ether complex, and iodotrimethylsilane may be used. Examples of the base catalyst include ammoniacal base compounds such as aqueous ammonia, and organic amines such as ethylamine and aniline. In addition, as the catalyst, catalysts described in paragraphs "0070" to "0076" of JP2013-201007A can also be used.

The content of the catalyst is preferably 0.1 to 100 parts by mass, more preferably 0.1 to 50 parts by mass, and still more preferably 0.1 to 20 parts by mass with respect to 100 parts by mass of the crosslinkable compound. The curable composition according to the embodiment of the present invention may include one catalyst or two or more kinds of catalysts. In a case where the curable composition includes two or more kinds of catalysts, it is preferable that the total content of the catalysts is within the above-described range.

<<Solvent>>

The curable composition according to the embodiment of the present invention contains a solvent. Examples of the solvent include an organic solvent. Basically, the solvent is not particularly limited as long as it satisfies the solubility of the respective components and the application properties of the curable composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide and 3-butoxy-N,N-dimethylpropanamide are also preferable from the viewpoint of improving solubility. In this case, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the present invention, a solvent having a low metal content is preferably used. For example, the metal content in the solvent is preferably 10 mass parts per billion (ppb) or less. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

In the present invention, as the organic solvent, an organic solvent containing 0.8 mmol/L or less of a peroxide is preferable, and an organic solvent containing substantially no peroxide is more preferable.

The content of the solvent is preferably 10 to 90 mass % with respect to the total mass of the curable composition according to the embodiment of the present invention. The lower limit is preferably 20 mass % or more, more preferably 30 mass % or more, still more preferably 40 mass % or more, even more preferably 50 mass % or more, and particularly preferably 60 mass % or more.

In addition, from the viewpoint of environmental regulation, it is preferable that the curable composition according to the embodiment of the present invention does not substantially contain environmentally regulated substances. In the present invention, the description "does not substantially contain environmentally regulated substances" means that the content of the environmentally regulated substances in the curable composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the curable composition according to the embodiment of the present invention, and may be incorporated into the curable composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, or curable composition produced by mixing these compounds.

<<Polymerization Inhibitor>>

The curable composition according to the embodiment of the present invention can contain a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), an N-nitrosophenylhydroxyamine salt (an ammonium salt, a cerous salt, or the like), and 2,2,6,6-tetramethylpiperidine 1-oxyl. The content of the polymerization inhibitor is preferably 0.0001 to 5 mass % with respect to the total solid content of the curable composition according to the embodiment of the present invention. The curable composition according to the embodiment of the present invention may include one polymerization inhibitor or two or more kinds of polymerization inhibitors. In a case where the curable composition includes two or more kinds of polymerization inhibitors, it is preferable that the total content of the polymerization inhibitors is within the above-described range.

<<Surfactant>>

The curable composition according to the embodiment of the present invention can contain a surfactant. As the surfactant, various surfactants such as a fluorine surfactant, a nonionic surfactant, a cationic surfactant, an anionic surfactant, or a silicon-based surfactant can be used. With regard to the surfactant, reference can be made to the description in paragraphs "0238" to "0245" of WO2015/166779A, the contents of which are incorporated herein by reference.

In the present invention, it is preferable that the surfactant is a fluorine surfactant. By containing a fluorine surfactant in the curable composition, liquid characteristics (particularly, fluidity) are further improved, and liquid saving properties can be further improved. In addition, it is possible to form a film with a small thickness unevenness.

The fluorine content in the fluorine surfactant is preferably 3 to 40 mass %, more preferably 5 to 30 mass %, and still more preferably 7 to 25 mass %. The fluorine surfactant in which the fluorine content is within the above-described range is effective in terms of the evenness of the thickness of the coating film or liquid saving properties and the solubility of the surfactant in the curable composition is also good.

Examples of the fluorine surfactant include surfactants described in paragraphs "0060" to "0064" of JP2014-041318A (paragraphs "0060" to "0064" of the corresponding WO2014/017669A) and the like, and surfactants described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound which has a molecular structure having a functional group containing a fluorine atom and in which, by applying heat to the molecular structure, the functional group containing a fluorine atom is broken to volatilize a fluorine atom can be used. Examples of such a fluorine surfactant include MEGAFACE DS series manufactured by DIC Corporation (for example, MEGAFACE DS-21).

In addition, as the fluorine surfactant, a copolymer of a fluorine atom-containing vinyl ether compound having a fluorinated alkyl group or a fluorinated alkylene ether group, and a hydrophilic vinyl ether compound can be used. With regard to such a fluorine surfactant, reference can be made to the description in JP2016-216602A, the contents of which are incorporated herein by reference.

As the fluorine surfactant, a block polymer can also be used. Examples of the block polymer include compounds described in JP2011-089090A. In addition, as the fluorine surfactant, a fluorine-containing copolymer including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can be used. For example, the following compound can also be used as the fluorine surfactant used in the present invention.

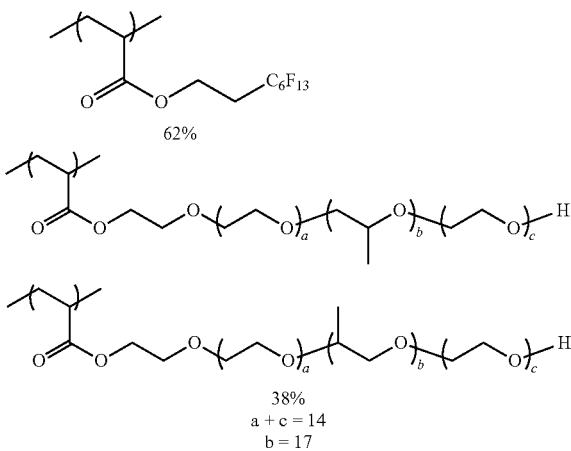

The weight-average molecular weight of the compound is preferably 3000 to 50000 and, for example, 14000. In the compound, "%" representing the proportion of a repeating unit is mol %.

In addition, as the fluorine surfactant, a fluorine-containing copolymer including a repeating unit having an ethylenically unsaturated group in the side chain can be used. Specific examples thereof include compounds described in paragraphs "0050" to "0090" and paragraphs "0289" to "0295" of JP2010-164965A, and MEGAFACE RS-101, RS-102, RS-718K, and RS-72-K manufactured by DIC Corporation. In addition, as the fluorine surfactant, compounds described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Corporation), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil & Fat Co., Ltd.), and OLFINE E1010 and SURFYNOL 104, 400, and 440 (all of which are manufactured by Nissin Chemical Co., Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Chemical Co., Ltd.), and BYK307, BYK323, and BYK330 (all of which are manufactured by BYK Chemie).

The content of the surfactant is preferably 0.001 mass % to 5.0 mass % and more preferably 0.005 to 3.0 mass % with respect to the total solid content of the curable composition. The curable composition according to the embodiment of the present invention may include one surfactant or two or more kinds of surfactants. In a case where the curable composition includes two or more kinds of surfactants, it is preferable that the total content of the surfactants is within the above-described range.

<<Ultraviolet Absorber>>

The curable composition according to the embodiment of the present invention can contain an ultraviolet absorber. Examples of the ultraviolet absorber include a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, and a triazine compound. With regard to details thereof, reference can be made to the description in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series manufactured by Miyoshi Oil & Fat Co., Ltd. (The Chemical Daily, Feb. 1, 2016).

The content of the ultraviolet absorber is preferably 0.01 to 10 mass % and more preferably 0.01 to 5 mass % with respect to the total solid content of the curable composition. The curable composition according to the embodiment of the present invention may include one ultraviolet absorber or two or more kinds of ultraviolet absorbers. In a case where the curable composition includes two or more kinds of ultraviolet absorbers, it is preferable that the total content of the ultraviolet absorbers is within the above-described range.

<<Other Additives>>

Various additives such as a filler, an adhesion promoter, an antioxidant, a potential antioxidant, and an aggregation inhibitor can be blended into the curable composition according to the embodiment of the present invention as necessary. Examples of these additives include the additives described in paragraphs "0155" and "0156" of JP2004-295116A, the contents of which are incorporated herein by reference. In addition, examples of the antioxidant include a phenol compound, a phosphorus-based compound (for example, compounds described in paragraphs "0042" of JP2011-090147A), a thioether compound. In addition, antioxidants described in WO2017/164024A can also be used. Examples of a commercially available product of the antioxidant include ADK STAB series (AO-20, AO-30, AO-40, AO-50, AO-50F, AO-60, AO-60G, AO-80, AO-330, and the like) manufactured by ADEKA Corporation. Examples of the potential antioxidant include a compound in which a portion that functions as the antioxidant is protected by a protective group and the protective group is desorbed by heating the compound at 100° C. to 250° C. or by heating the compound at 80° C. to 200° C. in the presence of an acid/a base catalyst. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation).

In addition, in order to adjust the refractive index of the film to be obtained, the curable composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and most preferably 5 to 50 nm. The metal oxide may have a core-shell structure, and in this case, the core portion may be hollow.

In addition, the curable composition according to the embodiment of the present invention may include a light-resistance improver. Examples of the light-resistance improver include the compounds described in paragraphs "0036" and "0037" of JP2017-198787A, the compounds described in paragraphs "0029" to "0034" of JP2017-146350A, the compounds described in paragraphs "0036" and "0037", and "0049" to "0052" of JP2017-129774A, the compounds described in paragraphs "0031" to "0034", "0058", and "0059" of JP2017-129674A, the compounds described in paragraphs "0036" and "0037", and "0051" to "0054" of JP2017-122803A, the compounds described in paragraphs "0025" to "0039" of WO2017/164127A, the compounds described in paragraphs "0034" to "0047" of JP2017-186546A, the compounds described in paragraphs "0019" to "0041" of JP2015-025116A, the compounds described in paragraphs "0101" to "0125" of JP2012-145604A, the compounds described in paragraphs "0018" to "0021" of JP2012-103475A, the compounds described in paragraphs "0015" to "0018" of JP2011-257591A, the compounds described in paragraphs "0017" to "0021" of JP2011-191483A, the compounds described in paragraphs "0108" to "0116" of JP2011-145668A, and the compounds described in paragraphs "0103" to "0153" of JP2011-253174A.

For example, in a case where a film is formed by application, the viscosity (23° C.) of the curable composition according to the embodiment of the present invention is preferably 1 to 100 mPa×s. The lower limit is more preferably 2 mPa×s or more and still more preferably 3 mPa×s or more. The upper limit is more preferably 50 mPa×s or less, still more preferably 30 mPa×s or less, and particularly preferably 15 mPa×s or less.

In the curable composition according to the embodiment of the present invention, the content of free metal which is not bonded to or coordinated with a pigment or the like is preferably 100 ppm or less, more preferably 50 ppm or less, and still more preferably 10 ppm or less, it is particularly preferable to not contain the free metal substantially. According to this aspect, the effects described in JP2012-153796A, JP2000-345085A, JP2005-200560A, JP1996-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can be obtained. Examples of the types of the above-described free metals include Na, K, Ca, Sc, Ti, Mn, Cu, Zn, Fe, Cr, Fe, Co, Mg, Al, Sn, Zr, Ga, Ge, Ag, Au, Pt, Cs, and Bi. In addition, in the curable composition according to the embodiment of the present invention, the content of free halogen which is not bonded to or coordinated with a pigment or the like is preferably 100 ppm or less, more preferably 50 ppm or less, and still more preferably 10 ppm or less, it is particularly preferable to not contain the free halogen substantially. Examples of a method for reducing free metals and halogens in the curable composition include washing with ion exchange water, filtration, ultrafiltration, and purification with an ion exchange resin.

A storage container of the curable composition according to the embodiment of the present invention is not particularly limited, and a known storage container can be used. In addition, as the storage container, in order to suppress infiltration of impurities into the raw materials or the curable composition, a multilayer bottle in which a container inner wall having a six-layer structure is formed of six kinds of resins or a bottle in which a container inner wall having a seven-layer structure is formed of six kinds of resins is preferably used. Examples of this container include a container described in JP2015-123351A. In addition, storage conditions of the curable composition according to the embodiment of the present invention is not particularly limited, and a known method in the related art can be used. In addition, a method described in JP2016-180058A can be used.

In a case where a film having a thickness of 1.0 μm is formed using the curable composition according to the embodiment of the present invention, the film preferably has a maximum absorption wavelength longer than the maximum absorption wavelength of the compound A in a chloroform solution, more preferably has a maximum absorption wavelength on a longer wavelength of 10 nm or more, and still more preferably has a maximum absorption wavelength on a longer wavelength of 30 nm or more.

In addition, in a case where a film having a thickness of 1.0 μm is formed using the curable composition according to the embodiment of the present invention, the film preferably has a maximum absorption wavelength in a range of 700 to 1400 nm.

Since the curable composition according to the embodiment of the present invention includes the above-described compound A, a film having excellent near-infrared shielding properties and visible transparency can be produced. Since it is desired that the near-infrared cut filter has excellent near-infrared shielding properties and visible transparency, the curable composition according to the embodiment of the present invention can be particularly preferably used as a composition for forming a near-infrared cut filter. In addition, by the curable composition according to the embodiment of the present invention including the coloring material which shields visible light, an infrared transmitting filter which can allow transmission of only near infrared light at a specific wavelength or higher can also be formed. Therefore, the curable composition according to the embodiment of the present invention can also be preferably used as a composition for forming an infrared transmitting filter.

<Method of Preparing Curable Composition>

The curable composition according to the embodiment of the present invention can be prepared by mixing the above-described components with each other. During the preparation of the curable composition, all the components may be dissolved or dispersed in a solvent at the same time to prepare the curable composition. Optionally, two or more solutions or dispersion liquids in which the respective components are appropriately blended may be prepared, and the solutions or dispersion liquids may be mixed with each other during use (during application) to prepare the curable composition.

In addition, in the preparation of the curable composition, a process of dispersing the pigment is preferably included. In the process of dispersing the pigment, examples of a mechanical force which is used for dispersing the pigment include compression, pressing, impact, shear, and cavitation. Specific examples of a unit for performing these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. In addition, it is preferable that rough particles are removed by filtering, centrifugal separation, and the like after pulverization treatment. In addition, as the process and dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph "0022" of JP2015-157893A can be used. In addition, in the process of dispersing the pigment, a refining treatment of pigments in a salt milling step may be performed. A material, a device, process conditions, and the like used in the salt milling step can be found in, for example, JP2015-194521A and JP2012-046629A.

During the preparation of the curable composition, it is preferable that the curable composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Advantec Toyo Kaisha, Ltd., Nihon Entegris G.K. (formerly Nippon Microlith Co., Ltd.), Kitz Microfilter Corporation, and the like can be used.

In addition, it is preferable that a fibrous filter material is used as the filter. Examples of the fibrous filter material include polypropylene fiber, nylon fiber, and glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components.

<Film>

Next, a film according to the embodiment of the present invention will be described. The film according to the embodiment of the present invention is obtained from the above-described curable composition according to the embodiment of the present invention. The film according to the embodiment of the present invention can be preferably used as a near-infrared cut filter, an infrared transmitting filter, and the like. The film according to the embodiment of the present invention may be a film having a pattern or a film (flat film) not having a pattern.

The film according to the embodiment of the present invention may be used in a state where it is laminated on a support, or may be used in a state where it is peeled off from a support. Examples of the support include a semiconductor base material such as silicon and a transparent base material. The transparent base material is not particularly limited as long as it is formed of a material which can allow transmission of at least visible light. Examples thereof include a base material formed of a material such as glass, crystal, and resin. Glass is preferable as the material of the transparent base material. That is, the transparent base material is preferably a glass base material. Examples of the glass include soda lime glass, borosilicate glass, non-alkali glass, quartz glass, and copper-containing glass. Examples of the copper-containing glass include a phosphate glass containing copper and a fluorophosphate glass containing copper. Examples of a commercially available product of the copper-containing glass include NF-50 (manufactured by AGC Techno Glass Co., Ltd.). Examples of the crystal include rock crystal, lithium niobate, and sapphire. Examples of the resin include polyester resins such as polyethylene terephthalate and polybutylene terephthalate, polyolefin resins such as polyethylene, polypropylene, and ethylene vinyl acetate copolymer, norbornene resin, acrylic resins such as polyacrylate and polymethylmethacrylate, urethane resin, vinyl chloride resin, fluororesin, polycarbonate resin, polyvinyl butyral resin, and polyvinyl alcohol resin. In addition, in order to enhance adhesiveness between the support and the film according to the embodiment of the present invention, an underlayer or the like may be provided on the surface of the support.

In a case where the film according to the embodiment of the present invention is used as a near-infrared cut filter, it is preferable that the film according to the embodiment of the present invention has a maximum absorption wavelength in a range of 700 to 1200 nm. The average light transmittance in a wavelength range of 400 to 550 nm is preferably 70% or more, more preferably 80% or more, still more preferably 85% or more, and particularly preferably 90% or more. In addition, the light transmittance in the entire wavelength range of 400 to 550 nm is preferably 70% or more, more preferably 80% or more, and still more preferably 90% or more. In addition, the light transmittance at at least one point in a wavelength range of 700 to 1000 nm is preferably 20% or less, more preferably 15% or less, and still more preferably 10% or less.

The film according to the embodiment of the present invention can be used in combination with a color filter which includes a chromatic colorant. The color filter can be manufactured using a coloring composition including a chromatic colorant. Examples of the chromatic colorant include the chromatic colorant described above. The coloring composition can further contain a curable compound, a photopolymerization initiator, a surfactant, a solvent, a polymerization inhibitor, an ultraviolet absorber, and the like. Examples of the details thereof include the above-described materials, and these can be used.

In a case where the film according to the embodiment of the present invention is used as a near-infrared cut filter and used in combination with a color filter, it is preferable that the color filter is disposed on an optical path of the film according to the embodiment of the present invention. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid-state imaging element may be interposed between the film according to the embodiment of the present invention and the color filter.

The thickness of the film according to the embodiment of the present invention can be a adjusted according to the purpose. The thickness of the film is preferably 20 µm or less, more preferably 10 µm or less, and still more preferably 5 µm or less. The lower limit of the thickness of the film is preferably 0.1 µm or more, more preferably 0.2 µm or more, and still more preferably 0.3 µm or more.

In the present invention, a near-infrared cut filter refers to a filter which allows transmission of light (visible light) in the visible range and shields at least a part of light (near infrared light) in the near infrared range. The near-infrared cut filter may be a filter which allows transmission of light in the entire wavelength range of the visible range, or may be a filter which allows transmission of light in a specific wavelength range of the visible range and shields light in another specific wavelength range of the visible range. In addition, in the present invention, a color filter refers to a filter which allows transmission of light in a specific wavelength range of the visible range and shields light in another specific wavelength range of the visible range. In addition, in the present invention, an infrared transmitting filter refers to a filter which shields visible light and allows transmission of at least a part of near infrared light.

<Film Forming Method>

Next, a method of forming the film according to the embodiment of the present invention will be described. The film according to the embodiment of the present invention can be formed through a step of applying the curable composition according to the embodiment of the present invention.

A support to which the curable composition is applied is not particularly limited, and examples thereof include a semiconductor base material such as silicon and the above-described transparent base material. An organic film or an inorganic film may be formed on the support. Examples of a material of the organic film include the resin described above. In addition, a charge coupled device (CCD), a complementary metal-oxide semiconductor (CMOS), a transparent conductive film, or the like may be formed on the support. In addition, a black matrix which separates respective pixels from each other may be formed on the support. In addition, optionally, an undercoat layer may be provided on the support to improve adhesiveness with a layer above the support, to prevent diffusion of substances, or to make the surface of the support flat. In addition, in a case where a glass base material is used as the support, it is preferable that an inorganic film is formed on the surface of the glass base material, or the glass base material is dealkalized to be used.

As a method of applying the curable composition, a known method can be used. Examples of the known method include: a drop casting method; a slit coating method; a spray method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A. In addition, with regard to the method of applying the resin composition, reference can be made to the description in WO2017/030174A and WO2017/018419A, the contents of which are incorporated herein by reference.

A composition layer formed by applying the curable composition may be dried (pre-baked). In a case where pre-baking is performed, the pre-baking temperature is preferably 150° C. or lower, more preferably 120° C. or lower, and still more preferably 110° C. or lower. The lower limit may be, for example, 50° C. or higher or 80° C. or higher. By performing the pre-baking at the temperature of 150° C. or lower, even in a case where, for example, a photoelectric conversion film of an image sensor is formed of an organic material, the characteristics of the organic material can be more effectively maintained. The pre-baking time is preferably 10 to 3000 seconds, more preferably 40 to 2500 seconds, and still more preferably 80 to 220 seconds. Pre-baking can be performed using a hot plate, an oven, or the like.

After the pre-baking, a heat treatment (post-baking) may be further performed. In a case where post-baking is performed, for example, the post-baking temperature is preferably 100° C. to 240° C. From the viewpoint of curing the film, the post-baking temperature is more preferably 180° C. to 240° C. The post-baking time is preferably 2 to 10 minutes and more preferably 4 to 8 minutes. Post-baking can be performed using a hot plate, an oven, or the like.

The method of forming the film according to the embodiment of the present invention may further include a step of forming a pattern. Examples of the pattern forming method include a pattern forming method using a photolithography method and a pattern forming method using a dry etching method. In a case where the film according to the embodiment of the present invention is used as a flat film, the step of forming a pattern is not necessarily performed. Hereinafter, the step of forming a pattern will be described in detail.

(Case where Pattern is Formed Using Photolithography Method)

It is preferable that the pattern forming method using a photolithography method includes: a step (exposure step) of exposing a composition layer, which is formed by applying the curable composition according to the embodiment of the present invention to a support, in a pattern shape; and a step (development step) of forming a pattern by removing the composition layer of an unexposed area by development.

<<Exposure Step>>

In the exposure step, the composition layer is exposed in a pattern shape. For example, the composition layer can be exposed in a pattern shape using a stepper exposure device or a scanner exposure device through a mask having a predetermined mask pattern. As a result, an exposed portion can be cured. Examples of the radiation (light) which can be used during the exposure include g-rays and i-rays. In addition, light (preferably light having a wavelength of 180 to 300 nm) having a wavelength of 300 nm or less can also be used. Examples of the light having a wavelength of 300 nm or less include KrF-rays (wavelength: 248 nm) and ArF-rays (wavelength: 193 nm), and KrF-rays (wavelength: 248 nm) are preferable.

In addition, in a case of exposure, the composition layer may be irradiated with light continuously to expose the composition layer, or the composition layer may be irradiated with light in a pulse to expose the composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m$^2$ or more, more preferably 100000000 W/m$^2$ or more, and still more preferably 200000000 W/m$^2$ or more. In addition, the upper limit of the maximum instantaneous illuminance is preferably 1000000000 W/m$^2$ or less, more preferably 800000000 W/m$^2$ or less, and still more preferably 500000000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

<<Development Step>>

Next, the composition layer of the unexposed area is removed by development to form a pattern. The composition layer of the unexposed area can be removed by development using a developer. Thus, the composition layer of the unexposed area in the exposure step is eluted into the developer, and as a result, only a photocured portion remains. For example, the temperature of the developer is preferably 20° C. to 30° C. The development time is preferably 20 to 180 seconds. In addition, in order to further improve residues removing properties, a step of shaking the developer off per 60 seconds and supplying a new developer may be repeated multiple times.

Examples of the developer include an organic solvent and an alkali developer. As the alkali developer, an alkaline aqueous solution in which an alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, and 1,8-diazabicyclo[5.4.0]-7-undecene; and an inorganic alkaline compound such as sodium hydroxide, potassium hydroxide, sodium carbonate, sodium bicarbonate, sodium silicate, and sodium metasilicate. In consideration of environmental aspects and safety aspects, the alkaline agent is preferably a compound having a high molecular weight. The concentration of the alkaline agent in the alkaline aqueous solution is preferably 0.001 to 10 mass % and more preferably 0.01 to 1 mass %. In addition, the developer may further contain a surfactant. Examples of the surfactant include the surfactants described above. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where the alkaline aqueous solution is used as a developer, it is preferable that the layer is washed (rinsed) with pure water after development. In addition, it is preferable that the rinsing is performed by supplying a rinsing liquid to the composition layer after development while rotating the support on which the composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation in supply amount of the rinsing liquid can be suppressed. In addition, the same effect can be obtained by gradually decreasing the rotating speed of the support while moving the nozzle from the center of the support to the peripheral edge of the support.

After the development, it is preferable to perform an additional exposure treatment or a heat treatment (post-baking) after carrying out drying. The additional exposure treatment or the post-baking is a heat treatment after development in order to complete curing, and the heat temperature is preferably, for example, 100° C. to 240° C. and more preferably 180° C. to 240° C. The film after development is post-baked continuously or batchwise using a heating unit such as a hot plate, a convection oven (hot air circulation dryer), and a high-frequency heater under the above-described conditions. In addition, the post-baking can also be performed by the method described in JP2016-172828A. In a case of performing the additional exposure treatment, light used for the exposure is preferably light having a wavelength of 400 nm or less. In addition, the additional exposure treatment may be performed by the method described in KR10-2017-122130A.

(Case where Pattern is Formed Using Dry Etching Method)

The formation of a pattern using a dry etching method can be performed using a method including: curing the composition layer on the support to form a cured composition layer; forming a patterned photoresist layer on the cured composition layer; and dry-etching the cured composition layer with etching gas by using the patterned photoresist layer as a mask. It is preferable that pre-baking treatment is further performed in order to form the photoresist layer. In particular, as the forming process of the photoresist layer, it is desirable that a heat treatment after exposure and a heat treatment after development (post-baking treatment) are performed. The details of the pattern formation using the dry etching method can be found in paragraphs "0010" to "0067" of JP2013-064993A, the content of which is incorporated herein by reference.

<Near-Infrared Cut Filter>

A near-infrared cut filter according to the embodiment of the present invention has the film according to the embodiment of the present invention. The near-infrared cut filter according to the embodiment of the present invention preferably has a maximum absorption wavelength in a range of 700 to 1200 nm. The average light transmittance in a wavelength range of 400 to 550 nm is preferably 70% or more, more preferably 80% or more, still more preferably 85% or more, and particularly preferably 90% or more. In addition, the light transmittance in the entire wavelength range of 400 to 550 nm is preferably 70% or more, more preferably 80% or more, and still more preferably 90% or more. In addition, the light transmittance at at least one point in a wavelength range of 700 to 1000 nm is preferably 20% or less, more preferably 15% or less, and still more preferably 10% or less.

The near-infrared cut filter according to the embodiment of the present invention may further have a dielectric multilayer film, an ultraviolet absorbing layer, and the like, in addition to the film according to the embodiment of the present invention. In a case where the near-infrared cut filter according to the embodiment of the present invention further has a dielectric multilayer film, a near-infrared cut filter having a wide viewing angle and an excellent near-infrared shielding properties can be obtained. In addition, in a case where the near-infrared cut filter according to the embodiment of the present invention further has an ultraviolet absorbing layer, a near-infrared cut filter having excellent ultraviolet shielding properties can be obtained. The details of the ultraviolet absorbing layer can be found in the description of an absorbing layer described in paragraphs "0040" to "0070" and "0119" to "0145" of WO2015/099060A, the content of which is incorporated herein by reference. The details of the dielectric multilayer film can be found in paragraphs "0255" to "0259" of JP2014-041318A, the content of which is incorporated herein by reference. In addition, in the near-infrared cut filter according to the embodiment of the present invention, a protective layer described in paragraphs "0073" to "0092" of JP2017-151176A may be provided on the surface of the film according to the embodiment of the present invention.

<Solid-State Imaging Element and Camera Module>

A solid-state imaging element according to the embodiment of the present invention has the film according to the embodiment of the present invention. In addition, a camera module according to the embodiment of the present invention has a solid-state imaging element and the near-infrared cut filter according to the embodiment of the present invention. The configuration of the solid-state imaging element according to the embodiment of the present invention is not particularly limited as long as it has the film according to the embodiment of the present invention and functions as a solid-state imaging element. For example, the following configuration can be adopted.

The solid-state imaging element has a plurality of photodiodes and transfer electrodes on the support, the photodiodes constituting a light receiving area of the solid-state imaging element, and the transfer electrode being formed of polysilicon or the like. In the solid-state imaging element, a light-shielding film formed of tungsten or the like which has openings through only light receiving portion of the photodiodes is provided on the photodiodes and the transfer electrodes, a device protective film formed of silicon nitride or the like is formed on the light-shielding film so as to cover the entire surface of the light-shielding film and the light receiving portions of the photodiodes, and the film according to the embodiment of the present invention is formed on the device protective film. Further, a configuration in which a light collecting unit (for example, a microlens; hereinafter, the same shall be applied) is provided above the device protective film and below the film according to the embodiment of the present invention (on a side thereof close the support), or a configuration in which a light collecting unit is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention has the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may be an image display device having a white organic EL element. It is preferable that the white organic EL element has a tandem structure. The tandem structure of the organic EL element is described in, for example, JP2003-045676A, or pp. 326 to 328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 to 700 nm) in addition to the above-described emission peaks.

<Infrared Sensor>

An infrared sensor according to the embodiment of the present invention has the above-described film according to the embodiment of the present invention. The configuration of the infrared sensor is not particularly limited as long as it functions as an infrared sensor. Hereinafter, an embodiment of the infrared sensor according to the present invention will be described using the drawings.

In FIG. 1, reference numeral 110 represents a solid-state imaging element. In an imaging region provided on the solid-state imaging element 110, near-infrared cut filters 111 and infrared transmitting filters 114 are provided. In addition, color filters 112 are laminated on the near-infrared cut filters 111. Microlenses 115 are disposed on an incidence ray hv side of the color filters 112 and the infrared transmitting filters 114. A planarizing layer 116 is formed so as to cover the microlenses 115.

The near-infrared cut filter 111 can be formed using the curable composition according to the embodiment of the present invention. Spectral characteristics of the near-infrared cut filters 111 can be selected according to the emission wavelength of an infrared light emitting diode (infrared LED) to be used. The color filters 112 is not particularly limited as long as pixels which allow transmission of light having a specific wavelength in a visible range and absorbs the light are formed therein, and a known color filter in the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the infrared transmitting filters 114 can be selected according to the emission wavelength of the infrared LED to be used. The infrared transmitting filters 114 can also be formed using the curable composition according to the embodiment of the present invention.

In the infrared sensor shown in FIG. 1, a near-infrared cut filter (other near-infrared cut filters) other than the near-infrared cut filter 111 may be further disposed on the planarizing layer 116. As the other near-infrared cut filters, for example, a layer containing copper and/or a dielectric multilayer film may be provided. In addition, as the other near-infrared cut filters, a dual band pass filter may be used. In addition, in the infrared sensor shown in FIG. 1, the positions of the near-infrared cut filter 111 and the color filter 112 may be switched. In addition, another layer may be disposed between the solid-state imaging element 110 and the near-infrared cut filter 111, and/or between the solid-state imaging element 110 and the infrared transmitting filter 114. Examples of another layer include an organic layer formed using a composition including a curable compound. In addition, a planarizing layer may be formed on the color filter 112.

EXAMPLES

Hereinafter, the present invention will be described in detail using Examples. Materials, used amounts, proportions, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

(Synthesis Example 1) Method of Synthesizing Compound I-1

A compound I-1 was synthesized according to the following synthetic scheme.

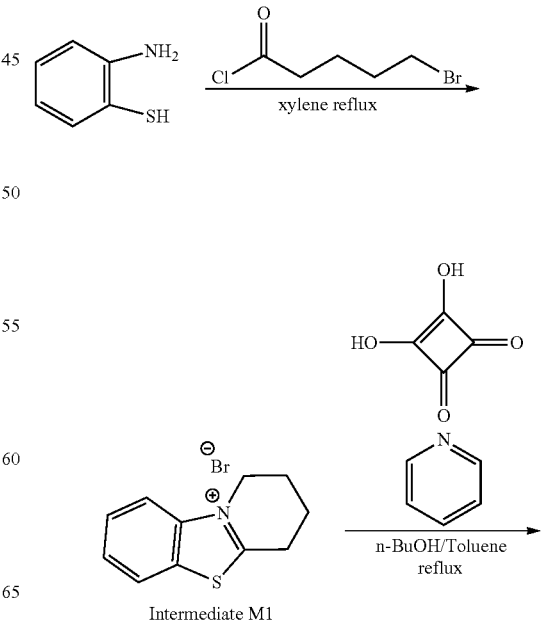

Intermediate M1

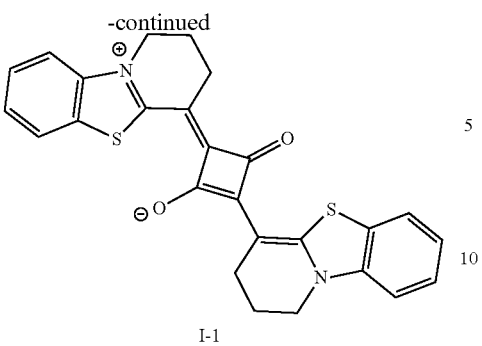

I-1

The synthesis of an intermediate M1 was carried out according to the above-described scheme and by reacting 2-aminobenzenethiol with 5-bromovaleryl chloride according to the method described in pp. 130 to 142 of Journal of Medicinal Chemistry, 1998, vol. 41.

The intermediate M1 (1.0 g, 3.7 mmol), squaric acid (0.19 g, 1.67 mmol), and pyridine (1.0 g, 12.6 mmol) in n-butanol/toluene (10 cm³/40 cm³) were heated under reflux for 6 hours while azeotropically dehydrating. After cooling the reaction solution, 50 ml of methanol was added thereto and the reaction solution was stirred for 30 minutes. The precipitate was collected by filtration to obtain a crude product. The crude product in methanol/water (30 cm³/10 cm³) was stirred for 30 minutes, and then filtered by suction to obtain a target compound (compound I-1) (0.4 g, yield: 53%).

Identification Data of Compound I-1:

¹H-NMR (CDCl₃):

δ2.11 (m, 4H), δ3.15 (t, 4H), δ3.95 (t, 4H),

δ7.06 (d, 2H), 7.14 (t, 2H), 7.31 (t, 2H), 7.47 (d, 2H)

MALDI Time of Flight Mass Spectrometry (TOF-MASS)

Calc. for [M+H]+: 457.1 found: 457.1

(Synthesis Example 2) Method of Synthesizing Compound I-4

A compound I-4 was synthesized by the same synthetic method as for the compound I-1.

(Synthesis Example 3) Method of Synthesizing Compound I-3

A compound I-3 was synthesized according to the following synthetic scheme.

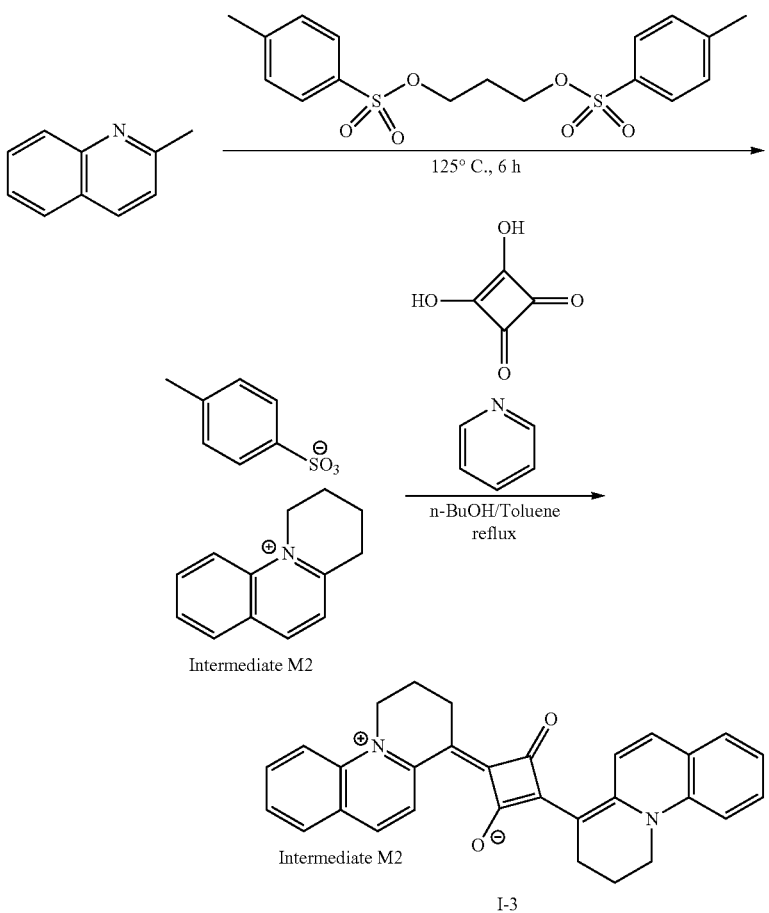

The synthesis of an intermediate M2 was carried out according to the above-described scheme and according to the method described in pp. 599 and 600 of Chemistry of Heterocyclic Compound, 1985, vol. 21, #5.

The intermediate M2 (7.11 g, 20 mmol), squaric acid (1.14 g, 10 mmol), and pyridine (2.37 g, 30 mmol) in n-butanol/toluene (21 cm³/85 cm³) were heated under reflux for 6 hours while azeotropically dehydrating. After cooling the reaction solution, the solvent was distilled off under reduced pressure, and the residues were purified by silica gel column chromatography (developing solvent: chloroform). After chloroform was distilled off under reduced pressure, the solid in methanol was stirred for 30 minutes, and then filtered by suction to obtain a target compound (compound I-3) (0.45 g, yield: 10%).

Identification Data of Compound I-3:
MALDI Time of Flight Mass Spectrometry (TOF-MASS)
Calc. for [M+H]+: 445.2 found: 445.2

(Synthesis Example 4) Method of Synthesizing Compound II-1

A compound II-1 was synthesized according to the following synthetic scheme.

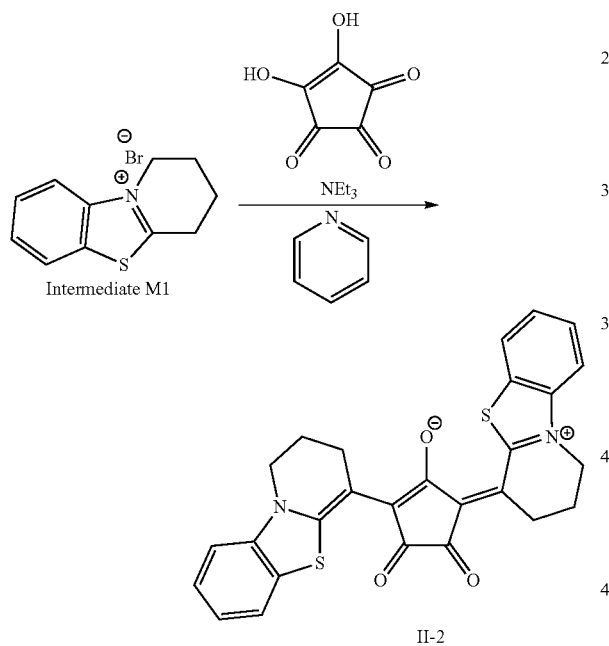

The intermediate M1 (1.50 g, 5.6 mmol) and croconic acid (0.39 g, 2.8 mmol) in triethylamine/pyridine (1 cm³/25 cm³) were stirred at room temperature for 12 hours. 40 ml of hexane was added to the reaction solution and the reaction solution was stirred for 30 minutes. The precipitate was collected by filtration to obtain a crude product. The crude product was purified by silica gel column chromatography (developing solvent: chloroform/methanol). After distilling off the solvent under reduced pressure, the crude product in methanol/water (10 cm³/40 cm³) was stirred for 30 minutes, and then filtered by suction to obtain a target compound (compound II-1) (0.3 g, yield: 15%).

Identification Data of Compound II-1:
¹H-NMR (d-DMSO):
δ2.13 (m, 4H), δ3.29 (t, 4H), δ4.29 (t, 4H),
δ 7.38 (t, 2H), 7.53 (t, 2H), 7.63 (d, 2H), 7.99 (d, 2H)
MALDI Time of Flight Mass Spectrometry (TOF-MASS)
Calc. for [M+H]+: 485.1 found: 485.1

(Synthesis Example 5) Method of Synthesizing Compound II-2

A compound II-2 was synthesized according to the following synthetic scheme.

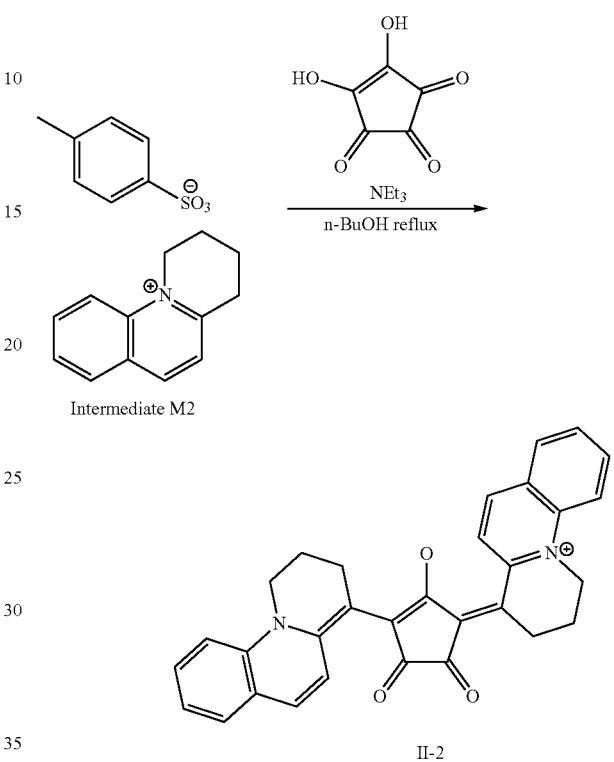

The intermediate M2 (3.0 g, 8.4 mmol), croconic acid (0.6 g, 4.2 mmol), and triethylamine (0.29 g, 8.4 mmol) in n-butanol (11 cm³) were heated under reflux for 3 hours. After cooling the reaction solution, the solvent was distilled off under reduced pressure, and the residues were purified by silica gel column chromatography (developing solvent: chloroform/methanol). After distilling off the solvent under reduced pressure, the solid in methanol/water (10 cm³/40 cm³) was stirred for 30 minutes, and then was filtered by suction to obtain a target compound (compound II-2) (0.2 g, yield: 10%).

Identification Data of Compound II-2:
MALDI Time of Flight Mass Spectrometry (TOF-MASS)
Calc. for [M+H]+: 473.2 found: 473.3

<Production of Dispersion Liquid>

520 parts by mass of zirconia beads having a diameter of 0.5 mm was added to a mixed solution of 13 parts by mass of a coloring agent compound shown in the following table, 15 parts by mass of a resin 6 solution, and 109 parts by mass of propylene glycol monomethyl ether acetate (PGMEA), and the mixed solution was subjected to a dispersion treatment for 30 minutes using a paint shaker. Thereafter, filtration was performed using DFA4201NIEY (0.45 μm nylon filter) manufactured by Nihon Pall Corporation, and the beads were separated by filtration to produce a dispersion liquid.

(Method for Producing Resin 6 Solution)

60 parts by mass of methyl methacrylate, 20 parts by mass of n-butyl methacrylate, and 13.2 parts by mass of tetramethylethylenediamine were charged into a reactor equipped with gas inlet pipe, condenser, stirring blade, and thermometer, the mixture was stirred at 50° C. for 1 hour while flowing nitrogen to replace the system with nitrogen. Next, 9.3 parts by mass of ethyl bromoisobutyrate, 5.6 parts by mass of cuprous chloride, and 133 parts by mass of PGMEA were added thereto, and the mixture was heated to 110° C. under a nitrogen stream to start a polymerization of a first block. After the polymerization for 4 hours, the polymerization solution was sampled to measure the solid content, and it was confirmed that the polymerization conversion rate was 98% or more in terms of the nonvolatile content.

Next, 61 parts by mass of PGMEA and 20 parts by mass of dimethylaminoethyl methacrylate (hereinafter, referred to as DM) as a second block monomer were charged into the reactor, and the reaction was continued while stirring the mixture at 110° C. under a nitrogen atmosphere. After 2 hours from the addition of dimethylaminoethyl methacrylate, the polymerization solution was sampled to measure the solid content, and it was confirmed that the polymerization conversion rate of the second block was 98% or more in terms of the nonvolatile content. After that, the reaction solution was cooled to room temperature to stop the polymerization. Propylene glycol monomethyl ether acetate was added to the previously synthesized block copolymer solution so that the nonvolatile content was 40 mass %. In this way, a resin 6 solution which has a poly (meth)acrylate skeleton having an amine value per solid content of 71.4 mgKOH/g, a weight-average molecular weight (Mw) of 9900, and a nonvolatile content of 40 mass %, and which has a tertiary amino group was obtained.

TABLE 1

|  | Type of coloring agent compound |
| --- | --- |
| Dispersion liquid 1 | I-1 |
| Dispersion liquid 2 | I-2 |
| Dispersion liquid 3 | I-3 |
| Dispersion liquid 4 | II-1 |
| Dispersion liquid 5 | II-2 |
| Dispersion liquid R1 | R-1 |
| Dispersion liquid R2 | R-2 |
| Dispersion liquid R3 | R-3 |

The coloring agent compounds shown in the above table are as follows.

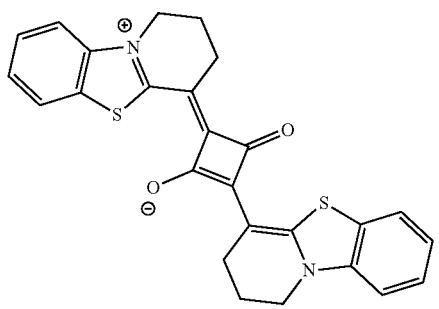

I-1

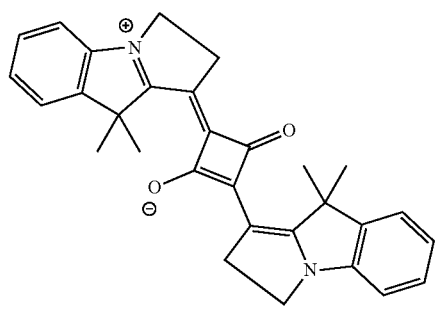

I-2

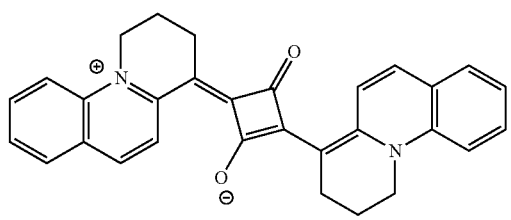

I-3

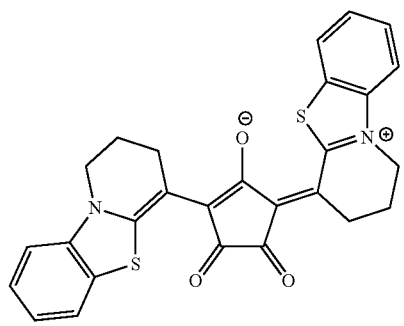

II-1

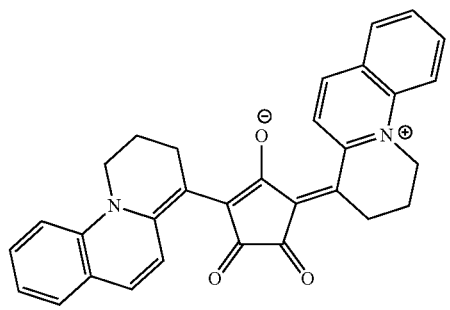

II-2

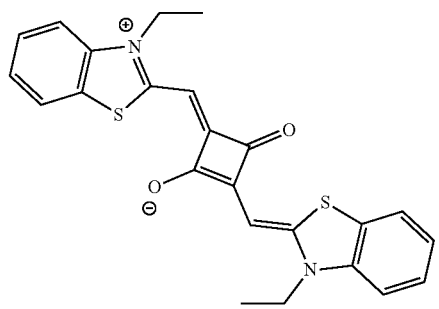

R-1

-continued

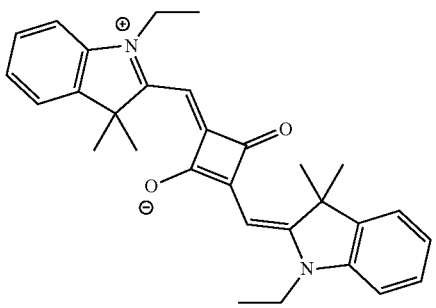

R-2

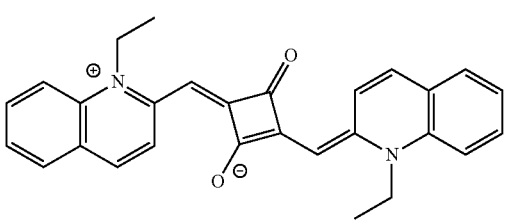

R-3

Crosslinkable monomer 1 . . . 12.9 parts by mass
Photopolymerization initiator 1 . . . 2.5 parts by mass
Ultraviolet absorber 1 . . . 0.5 parts by mass
Surfactant 1 . . . 0.04 parts by mass
Polymerization inhibitor (p-methoxyphenol) . . . 0.006 parts by mass
Cyclohexanone . . . 49.6 parts by mass
PGMEA . . . 19.3 parts by mass
(Composition 3)
Compound I-4 . . . 2.3 parts by mass
Resin 3 . . . 12.8 parts by mass
Ultraviolet absorber 1 . . . 0.5 parts by mass
Surfactant 1 . . . 0.04 parts by mass
Cyclohexanone . . . 84.36 parts by mass
(Composition 4)
Compound I-4 . . . 2.3 parts by mass
Resin 4 . . . 12.8 parts by mass
Ultraviolet absorber 1 . . . 0.5 parts by mass
Surfactant 1 . . . 0.04 parts by mass
Cyclohexanone . . . 64.36 parts by mass
N-methylpyrrolidone . . . 20 parts by mass
Raw materials used for each curable composition are as follows.

Compound I-4: compound having the following structure

I-4

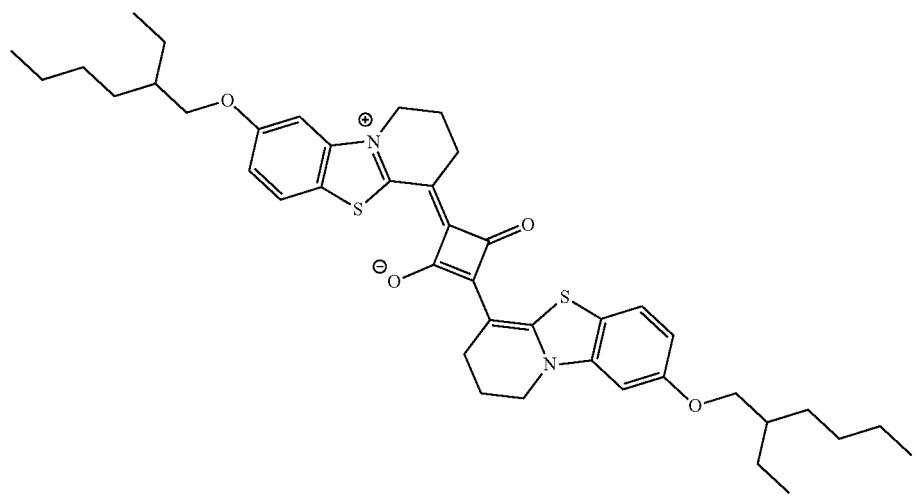

<Production of Curable Composition>

Raw materials shown in the following compositions 1 to 4 were mixed and stirred, and the obtained mixture was filtered using a nylon filter (manufactured by Nihon Pall Corporation) having a pore size of 0.45 μm to prepare a curable composition.

(Composition 1)
Dispersion liquid shown in the table below . . . 60 parts by mass
Crosslinkable monomer 1 . . . 6 parts by mass
Resin 1 . . . 4.45 parts by mass
Photopolymerization initiator 1 . . . 1.99 parts by mass
Surfactant 1 . . . 4.17 parts by mass
Polymerization inhibitor (p-methoxyphenol) . . . 0.003 parts by mass
PGMEA . . . 23.39 parts by mass
(Composition 2)
Compound I-4 . . . 2.3 parts by mass
Resin 2 . . . 12.9 parts by mass Resin 1: CYCLOMER P (ACA) 230AA (manufactured by Daicel Corporation)
Resin 2: copolymer of allyl methacrylate (AMA) and methacrylic acid (MAA) (compositional ratio (mass ratio): (AMA/MAA)=(80/20), Mw=15,000)
Resin 3: ARTON F4520 (manufactured by JSR Corporation)
Resin 4: Neoprim (registered trademark) C3450 (manufactured by MITSUBISHI GAS CHEMICAL COMPANY, INC.)
Crosslinkable monomer 1: KAYARAD DPHA (manufactured by Nippon Kayaku Co., Ltd.)
Photopolymerization initiator 1: IRGACURE-OXE01 (manufactured by BASF) [2-(O-benzoyloxime)-1-[4-(phenylthio)phenyl]-1,2-octanedione] Ultraviolet absorber 1: UV-503 (manufactured by Daito Chemical Co., Ltd.)
Surfactant 1: compound having the following structure (Mw=14000; "%" representing the proportion of a repeating unit is mol %)

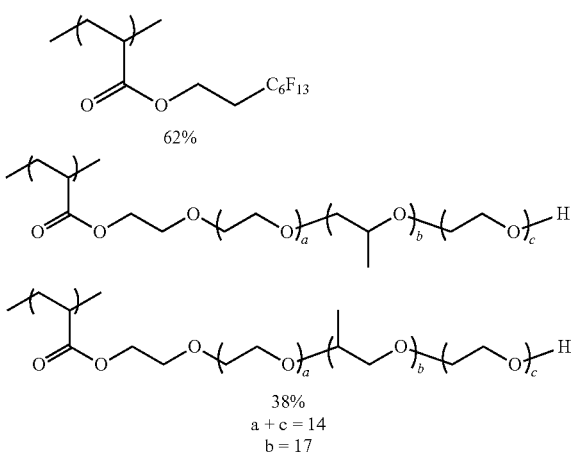

TABLE 2

| | Type of dispersion liquid or coloring agent compound used | Coloring agent compound included in curable compound | Type of composition |
|---|---|---|---|
| Example 1 | Dispersion liquid 1 | I-1 | Composition 1 |
| Example 2 | Dispersion liquid 2 | I-2 | Composition 1 |
| Example 3 | Dispersion liquid 3 | I-3 | Composition 1 |
| Example 4 | Dispersion liquid 4 | II-1 | Composition 1 |
| Example 5 | Dispersion liquid 5 | II-2 | Composition 1 |
| Example 6 | — | I-4 | Composition 2 |
| Example 7 | — | I-4 | Composition 3 |
| Example 8 | — | I-4 | Composition 4 |
| Comparative Example 1 | Dispersion liquid R-1 | R-1 | Composition 1 |
| Comparative Example 2 | Dispersion liquid R-2 | R-2 | Composition 1 |
| Comparative Example 3 | Dispersion liquid R-3 | R-3 | Composition 1 |

Production of Cured Film

Production Example 1

(Method for Producing Cured Film Using Curable Compositions of Compositions 1 and 2)

Each of the curable compositions was applied to a glass base material (1737 manufactured by Corning Inc.) using a spin coater such that the thickness of a film after drying was 1.0 μm, and a heat treatment (pre-baking) was performed for 120 seconds using a hot plate at 100° C. Next, using an i-ray stepper exposure device FPA-3000 i5+(manufactured by Canon Corporation), the entire surface of the coating film was exposed at 500 mJ/cm². Next, using a developing machine (CD-2060, manufactured by FUJIFILM Electronic Materials Co., Ltd.), a puddle development was performed at 23° C. for 60 seconds, and then rinse treatment was performed with pure water and spin drying was performed. Furthermore, a heat treatment (post-baking) was performed for 300 seconds using a hot plate at 200° C., thereby obtaining a cured film.

Production Example 2

(Method for Producing Film Using Curable Compositions of Compositions 3 and 4)

Each of the curable compositions was applied to a glass base material (1737 manufactured by Corning Inc.) using a spin coater such that the thickness of a film after drying was 1.0 μm, and a heat treatment (pre-baking) was performed for 120 seconds using a hot plate at 100° C. Next, a heat treatment (post-baking) was performed for 300 seconds using a hot plate at 200° C., thereby obtaining a film.

<Measurement of Maximum Absorption Wavelength>

Using a spectrophotometer UV-3100PC (manufactured by Shimadzu Corporation), the absorption spectrum of the obtained film was measured, and the maximum absorption wavelength (λmax) of the film was measured.

In addition, the maximum absorption wavelength (λmax) of the coloring agent compound formed of the curable compound was measured by preparing a chloroform solution of the coloring agent compound formed of each curable compound, measuring an absorption spectrum of the chloroform solution of each coloring agent compound using a spectrophotometer UV-3100PC (manufactured by Shimadzu Corporation), and measuring a maximum absorption wavelength (λmax) of the coloring agent compound in the chloroform solution.

<Light Resistance>

After the obtained film was irradiated with light of 20000 lux for 10 hours from a Xe lamp through an ultraviolet cut filter, the color difference ΔEab value before and after the light resistance test was measured with a colorimeter MCPD-1000 (manufactured by OTSUKA ELECTRONICS Co., Ltd.). As the ΔEab value is smaller, light resistance is better. The ΔEab value is a value acquired using the following color difference expression based on the CIE1976 (L*, a*, b*) space color system (The Color Science Handbook (1985), new edition, p. 266, edited by The Color Science Association of Japan).

$\Delta Eab = \{(\Delta L^*)^2 + (\Delta a^*)^2 + (\Delta b^*)^2\}^{1/2}$

<<Judgment Criteria>>

A: ΔEab value<2.5
B: 2.5≤ΔEab value<5
C: 5≤ΔEab value<10
D: 10≤ΔEab value<15
E: 15≤ΔEab value <Moisture Resistance>

A moisture resistance test was performed to the obtained film by allowing the obtained film to stand for 15 hours under a high temperature and high humidity condition of 85° C. and a relative humidity of 85%. Regarding each of the films before and after the moisture resistance test, using a spectrophotometer (U-4100, manufactured by Hitachi High-Tech Corporation), the maximum absorbance (Absλmax) in a wavelength of 650 to 1100 nm and the minimum absorbance (Absλmin) in a wavelength of 400 to 650 nm were measured, an absorbance ratio represented by "Absλmax/Absλmin" was obtained.

The rate (%) of change in absorbance ratio, represented by |{(absorbance ratio of film before moisture resistance test—absorbance ratio of film after moisture resistance test)/absorbance ratio of film before moisture resistance test}×100|, was evaluated according to the following criteria. The results are shown in the following table.

A: rate of change in absorbance ratio≤2%
B: 2%<rate of change in absorbance ratio≤4%
C: 4%<rate of change in absorbance ratio≤7%
D: 7%<rate of change in absorbance ratio≤10%
E: 10%<rate of change in absorbance ratio (Evaluation of Spectral Characteristics)

Using a spectrophotometer (U-4100, manufactured by Hitachi High-Tech Corporation), the absorption spectrum of the obtained film in a wavelength range of 400 to 1100 nm was measured. The maximum absorbance (AbsλMax) in a wavelength of 650 to 1100 nm was measured, and "average absorbance at 400 to 600 nm" in a case where the maximum absorbance was set to be 1 was evaluated according to the following criteria. As the absorbance at 400 to 600 nm is smaller in a case where this absorbance is set to be 1, since the absorption spectrum has a steep spectral shape, and both high transparency in the visible light region and high shielding properties in the near infrared range are achieved, it can be said that the obtained film has excellent spectral characteristics.

A: less than 0.05
B: 0.05 or more and less than 0.1
C: 0.1 or more and less than 0.2
D: 0.2 or more

TABLE 3

| | λmax of coloring agent compound in chloroform solution (nm) | λmax of film (nm) | Light resistance | Heat resistance | Spectral characteristics |
|---|---|---|---|---|---|
| Example 1 | 714 | 742 | A | A | B |
| Example 2 | 680 | 710 | B | B | C |
| Example 3 | 754 | 790 | B | A | A |
| Example 4 | 852 | 880 | B | B | B |
| Example 5 | 820 | 845 | B | B | B |
| Example 6 | 725 | 740 | B | B | A |
| Example 7 | 725 | 730 | B | B | A |
| Example 8 | 725 | 732 | B | B | A |
| Comparative Example 1 | 669 | 575 | E | D | D |
| Comparative Example 2 | 612 | 560 | E | E | D |
| Comparative Example 3 | 732 | 660 | E | D | D |

As shown in the table, the curable compositions of Examples were capable of forming a film having excellent light resistance and moisture resistance. In addition, the film obtained using the curable composition of each Example had a maximum absorption wavelength in the near-infrared range, was excellent in near-infrared shielding properties and visible transparency, and had excellent spectral characteristics.

EXPLANATION OF REFERENCES

110: solid-state imaging element
111: near-infrared cut filter
112: color filter
114: infrared transmitting filter
115: microlens
116: planarizing layer

What is claimed is:
1. A curable composition comprising:
a compound represented by Formula (1) or Formula (2);
a curable compound; and
a solvent,

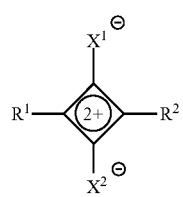
(1)

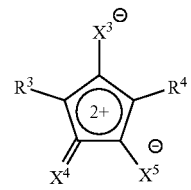
(2)

in Formula (1), $X^1$ and $X^2$ each independently represent O, S, or a dicyanomethylene group, and $R^1$ and $R^2$ each independently represent an aryl group, a heterocyclic group, a group represented by Formula (R1), a group represented by Formula (R2-11), a group represented by Formula (R2-12), a group represented by Formula (R2-13), or a group represented by Formula (R2-14), in which at least one of $R^1$ or $R^2$ is the group represented by Formula (R2-11), the group represented by Formula (R2-12), the group represented by Formula (R2-13), or the group represented by Formula (R2-14), in Formula (2), $X^3$ to $X^5$ each independently represent O, S, or a dicyanomethylene group, and $R^3$ and $R^4$ each independently represent an aryl group, a heterocyclic group, the group represented by Formula (R1), or the group represented by Formula (R2-11), a group represented by Formula (R2-12), a group represented by Formula (R2-13), or a group represented by Formula (R2-14), in which at least one of $R^3$ or $R^4$ is the group represented by Formula (R2-11), the group represented by Formula (R2-12), the group represented by Formula (R2-13), or the group represented by Formula (R2-14),

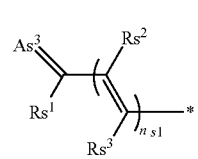
(R1)

in Formula (R1), * represents a bonding hand,
$Rs^1$ to $Rs^3$ each independently represent a hydrogen atom or an alkyl group,
$As^3$ represents a heterocyclic group, and
$n_{s1}$ represents an integer of 0 or more,
in which $Rs^1$ and $Rs^2$ may be bonded to each other to form a ring,
$Rs^1$ and $As^3$ may be bonded to each other to form a ring,
$Rs^2$ and $Rs^3$ may be bonded to each other to form a ring, and
in a case where $n_{s1}$ is 2 or more, a plurality of $Rs^2$'s and $Rs^3$'s may be the same or different from each other,

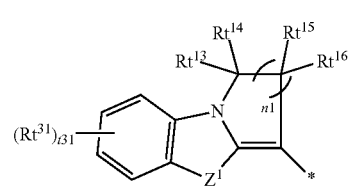
(R2-11)

-continued

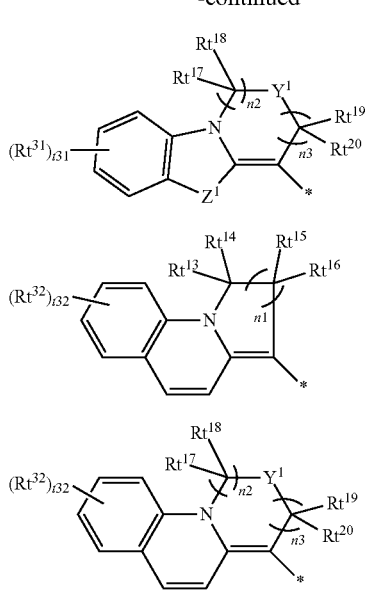

(R2-12)

(R2-13)

(R2-14)

where, $Rt^{13}$ to $Rt^{20}$ each independently represent a hydrogen atom or a substituent, $Rt^{31}$ and $Rt^{32}$ each independently represent a substituent, $Y^1$ represents O, S, C(=O), S(=O), or $SO_2$, $Z^1$ represents O, S, or $NR^{z1}$, in which $R^{z1}$ represents a hydrogen atom or a substituent, t31 represents an integer of 0 to 4, t32 represents an integer of 0 to 6, in a case where t31 is 2 or more, a plurality of $Rt^{31}$'s may be the same or different from each other and two $Rt^{31}$'s of the plurality of $Rt^{31}$'s may be bonded to each other to form a ring, in a case where t32 is 2 or more, a plurality of $Rt^{32}$'s may be the same or different from each other and two $Rt^{32}$'s of the plurality of $Rt^{32}$'s may be bonded to each other to form a ring, n1 represents an integer of 0 to 4, and n2 and n3 each independently represent an integer of 1 to 3, in which n2+n3 is an integer of 2 to 4.

2. The curable composition according to claim 1, wherein the compound represented by Formula (1) or Formula (2) has a maximum absorption wavelength in a wavelength range of 600 to 1300 nm in a chloroform solution.

3. The curable composition according to claim 1, wherein, in a case where a film having a thickness of 1.0 μm is formed using the curable composition, the film has a maximum absorption wavelength longer than a maximum absorption wavelength of the compound represented by Formula (1) or Formula (2) in a chloroform solution.

4. The curable composition according to claim 1, wherein, in a case where a film having a thickness of 1.0 μm is formed using the curable composition, the film has a maximum absorption wavelength in a range of 700 to 1400 nm.

5. A film which is formed from the curable composition according to claim 1.

6. A near-infrared cut filter comprising:
the film according to claim 5.

7. A camera module comprising:
a solid-state imaging element; and
the near-infrared cut filter according to claim 6.

8. A solid-state imaging element comprising:
the film according to claim 5.

9. An image display device comprising:
the film according to claim 5.

10. An infrared sensor comprising:
the film according to claim 5.

* * * * *